(12) United States Patent
Ogita et al.

(10) Patent No.: US 9,253,456 B2
(45) Date of Patent: Feb. 2, 2016

(54) SOLID-STATE IMAGING DEVICE, METHOD OF MANUFACTURING SOLID-STATE IMAGING DEVICE, AND ELECTRONIC APPARATUS

(71) Applicant: Sony Corporation, Tokyo (JP)

(72) Inventors: Tomoharu Ogita, Kumamoto (JP); Atsushi Yamamoto, Kumamoto (JP); Keiji Tatani, Kumamoto (JP); Yoichi Ootsuka, Kumamoto (JP); Kiyotaka Tabuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/277,383

(22) Filed: May 14, 2014

(65) Prior Publication Data

US 2014/0300785 A1    Oct. 9, 2014

Related U.S. Application Data

(63) Continuation of application No. 13/548,900, filed on Jul. 13, 2012, now Pat. No. 8,767,108, which is a continuation-in-part of application No. 13/362,722, filed on Jan. 31, 2012, now Pat. No. 8,742,525.

(30) Foreign Application Priority Data

Mar. 14, 2011   (JP) ................................. 2011-055631

(51) Int. Cl.
*H01L 27/146* (2006.01)
*H04N 9/04* (2006.01)

(52) U.S. Cl.
CPC .......... *H04N 9/045* (2013.01); *H01L 27/14621* (2013.01); *H01L 27/14623* (2013.01); *H01L 27/14627* (2013.01); *H01L 27/14685* (2013.01)

(58) Field of Classification Search
CPC ............... H04N 9/045; H01L 27/1461; H01L 27/14623; H01L 27/14627; H01L 27/14685
USPC .................................. 348/302–308; 250/208.1
See application file for complete search history.

(56) References Cited

U.S. PATENT DOCUMENTS

| | | | |
|---|---|---|---|
| 6,081,018 A | 6/2000 | Nakashiba et al. | |
| 7,791,659 B2 * | 9/2010 | Yokozawa | 348/273 |

(Continued)

FOREIGN PATENT DOCUMENTS

| | | |
|---|---|---|
| JP | 2005-033074 A | 2/2005 |
| JP | 2005-236325 A | 9/2005 |

(Continued)

OTHER PUBLICATIONS

Chinese Office Action issued Jul. 29, 2015 for Corresponding Chinese Application No. 201210058232.3.

(Continued)

*Primary Examiner* — Gevell Selby
(74) *Attorney, Agent, or Firm* — Michael Best & Friedrich LLP

(57) ABSTRACT

A solid-state imaging device includes pixels each having a photoelectric conversion element for converting incident light to an electric signal, color filters associated with the pixels and having a plurality of color filter components, microlenses converging the incident light through the color filters to the photoelectric conversion elements, a light shielding film disposed between the color filter components of the color filters, and a nonplanarized adhesive film provided between the color filters and the light shielding film.

30 Claims, 27 Drawing Sheets

(56) References Cited

U.S. PATENT DOCUMENTS

| | | |
|---|---|---|
| 2001/0054677 A1* | 12/2001 | Nakashima ................ 250/208.1 |
| 2003/0146387 A1 | 8/2003 | Sakai |
| 2007/0210395 A1 | 9/2007 | Maruyama et al. |
| 2010/0025571 A1* | 2/2010 | Toumiya et al. ........... 250/208.1 |
| 2010/0065845 A1 | 3/2010 | Nakayama |
| 2012/0154624 A1 | 6/2012 | Kobayashi |
| 2012/0276680 A1 | 11/2012 | Takizawa |
| 2013/0171760 A1 | 7/2013 | Abe et al. |

FOREIGN PATENT DOCUMENTS

| | | |
|---|---|---|
| JP | 2006-237122 A | 9/2006 |
| JP | 2010-085755 | 4/2010 |

OTHER PUBLICATIONS

Japanese Office Action issued Oct. 20, 2015 for corresponding Japanese Application No. 2011-261520.

* cited by examiner

FIG. 24A (a) (b)
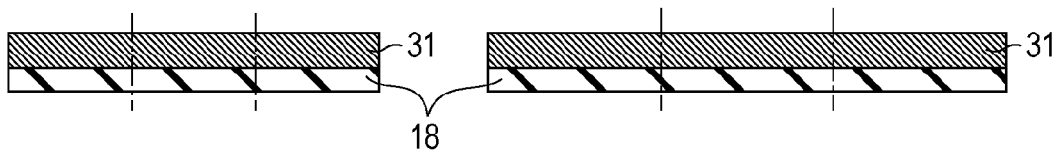
FIG. 24B (a) (b)
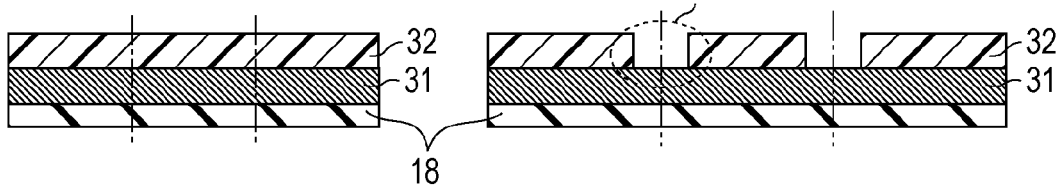
FIG. 24C (a) (b)
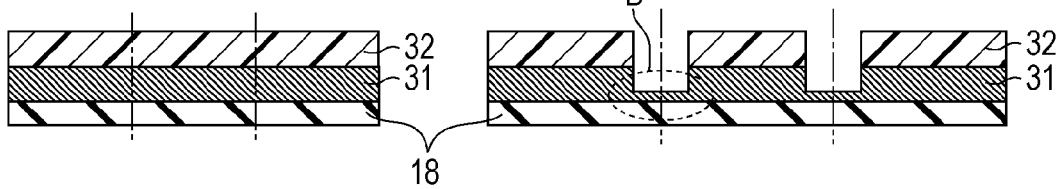
FIG. 24D (a) (b)
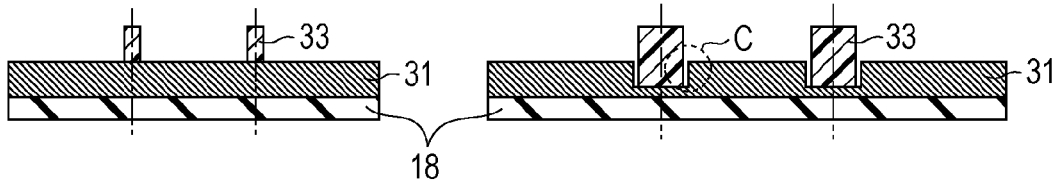
FIG. 24E (a) (b)
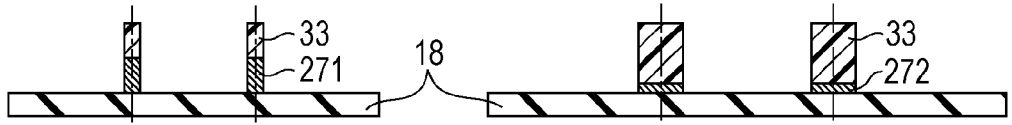
FIG. 24F (a) (b)
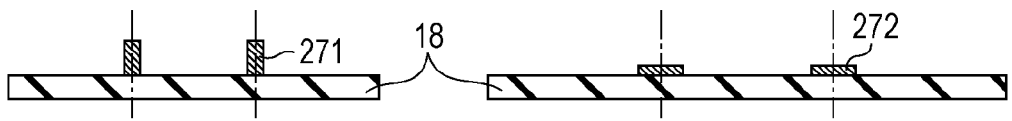

SOLID-STATE IMAGING DEVICE, METHOD OF MANUFACTURING SOLID-STATE IMAGING DEVICE, AND ELECTRONIC APPARATUS

CROSS REFERENCE TO RELATED APPLICATIONS

This application is a Continuation Application of U.S. patent application Ser. No. 13/548,900, filed Jul. 13, 2012, which is a Continuation-In-Part of U.S. patent application Ser. No. 13/362,722, filed Jan. 31, 2012, which claims priority from Japanese Application No.: 2011-055631, filed on Mar. 14, 2011 and Japanese Application No.: 2012-044006, filed on Feb. 29, 2012, the entire contents of which are incorporated herein by reference.

BACKGROUND

The present technology relates to a solid-state imaging device, a method of manufacturing a solid-state imaging device, and an electronic apparatus.

CCD (charge coupled device) solid-state imaging devices and CMOS (complementary metal oxide semiconductor) solid-state imaging device are in widespread use in digital cameras and video cameras. These solid-state imaging devices are roughly classified into two groups in terms of the direction of the light incident on a light receiving unit.

One of them includes solid-state imaging devices that receive light incident on the front side of the semiconductor substrate on which a wiring layer is formed. The other group includes the so-called back-illuminated-type solid-state imaging devices that receive light incident on the back side of the semiconductor substrate on which no wiring layer is formed.

These solid-state imaging devices have a light shielding film for blocking light between pixels to improve sensitivity and prevent color mixture. There is a demand for a solid-state imaging device with further improved image quality and sensitivity and with further suppressed color mixture. Further miniaturization will degrade the overlay accuracy between layers, especially between a light shielding film, color filters, and microlenses, with a significant effect on the color mixture.

To reduce the height of the solid-state imaging device and to improve overlay accuracy of the light shielding film and color filters, a light shielding film for reducing the color mixture with the adjacent pixels is formed on the same plane as the color filters in the solid-state imaging device of Japanese Unexamined Patent Application Publication No. 2010-85755, for example.

SUMMARY

There is a problem, however, with the technique disclosed by Japanese Unexamined Patent Application Publication No. 2010-85755 that the color filters are easily detached from the semiconductor substrate because the color filters are formed on the light shielding film and semiconductor substrate.

It is desirable to provide a solid-state imaging device and a method of manufacturing a solid-state imaging device that can suppress the detachment of color filters.

It is also desirable to provide an electronic apparatus provided with such a solid-state imaging device.

A solid-state imaging device according to an embodiment of the present technology includes pixels each having a photoelectric conversion element for converting incident light to an electric signal, color filters associated with the pixels and having a plurality of color filter components, microlenses for converging the incident light through the color filters onto the photoelectric conversion elements, a light shielding film disposed between the color filter components of the color filters, and a nonplanarized adhesive film provided between the color filters and the light shielding film.

In the solid-state imaging device according to the embodiment of the present technology, the detachment of color filters can be suppressed by the nonplanarized adhesive film disposed between the color filters and the light shielding film.

A method of manufacturing a solid-state imaging device according to an embodiment of the present technology includes forming pixels each having a photoelectric conversion element for converting incident light to an electric signal, forming a light shielding film to be provided between a plurality of color filter components of color filters, depositing a nonplanarized adhesive film on the light shielding film, forming the color filters on the adhesive film between the light shielding films, and forming on the color filters microlenses for converging the incident light through the color filters onto the photoelectric conversion elements.

An electronic apparatus according to an embodiment of the present technology includes the above-mentioned solid-state imaging device, an optical lens, and a signal processing circuit.

According to the embodiments of the present technology, the detachment of color filters can be suppressed.

BRIEF DESCRIPTION OF THE DRAWINGS

FIGS. 24A to 24F illustrate steps of manufacturing the light shielding film according to the eleventh embodiment;

DETAILED DESCRIPTION OF EMBODIMENTS (First Embodiment)

Figure 1:
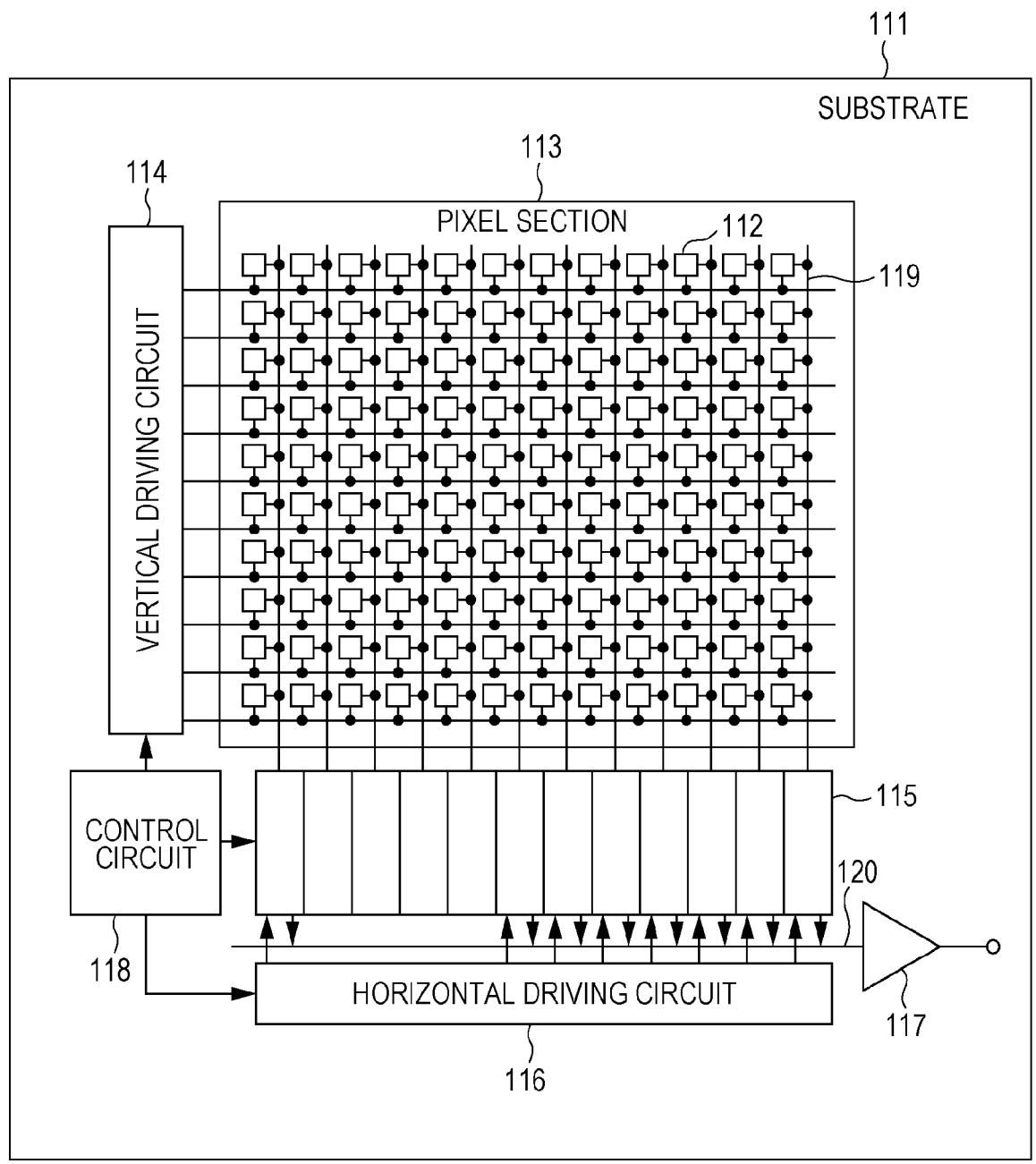
FIG. 1 illustrates a solid-state imaging device according to a first embodiment.

FIG. 1 is a schematic block diagram showing an exemplary solid-state imaging device 100 according to a first embodiment of the present technology. The solid-state imaging device 100 shown in FIG. 1 includes a substrate 111 made of silicon, a pixel section 113 including a plurality of pixels 112 arranged in an array on the substrate 111, a vertical driving circuit 114, column signal processing circuits 115, a horizontal driving circuit 116, an output circuit 117, and a control circuit 118.

The pixel section 113 includes a plurality of pixels 112 regularly arranged in a two-dimensional array. The pixel section 113 includes an effective pixel region that actually receives incident light, amplifies the signal charge generated by photoelectric conversion from the incident light, and outputs the amplified signal charge to a column signal processing circuit 115, as well as a black reference pixel region (not shown) for outputting the optical black to be used as a reference black level. The black reference pixel region is normally formed in a periphery of the effective pixel region.

A pixel 112 includes a photodiode as a photoelectric conversion element (not shown) and a plurality of pixel transistors (not shown). A plurality of pixels 112 are regularly arranged in a two-dimensional array on the substrate 111. The plurality of pixel transistors may include four MOS transistors including a transfer transistor, reset transistor, selection transistor, and amplification transistor, or may include the above three transistors excluding the selection transistor.

According to a vertical synchronization signal, horizontal synchronization signal, and a master clock, the control circuit 118 generates clock signals and control signals to be used as reference signals for operations of the vertical driving circuit 114, column signal processing circuits 115, and horizontal driving circuit 116. The control circuit 118 uses the clock signals and control signals to control the vertical driving circuit 114, column signal processing circuits 115, and horizontal driving circuit 116.

The vertical driving circuit 114 is formed of, for example, shift registers and selectively scans the pixels 112 sequentially row by row in the vertical direction. The vertical driving circuit 114 supplies pixel signals based on the signal charges generated in accordance with the amounts of light received by the photoelectric conversion elements of the pixels 112 to the column signal processing circuits 115 through vertical signal lines 119.

The column signal processing circuits 115 correspond to the columns of, for example, pixels 112 and perform for the associated pixel columns signal processing such as denoising and signal amplification for the signals output from one row of pixels 112 on the basis of the signals from the black reference pixel region. A horizontal selection switch (not shown) is provided between the output stage of the column signal processing circuit 115 and the horizontal signal line 120.

The horizontal driving circuit 116 is formed of shift registers, for example. The horizontal driving circuit 116 sequentially outputs horizontal scanning pulses to select the column signal processing circuits 115 in sequence and cause each of the column signal processing circuits 115 to output a pixel signal to the horizontal signal line 120.

The output circuit 117 processes the pixel signals sequentially supplied from the column signal processing circuits 115 through the horizontal signal line 120 and outputs the processed signals to an external apparatus (not shown).

Figure 2:
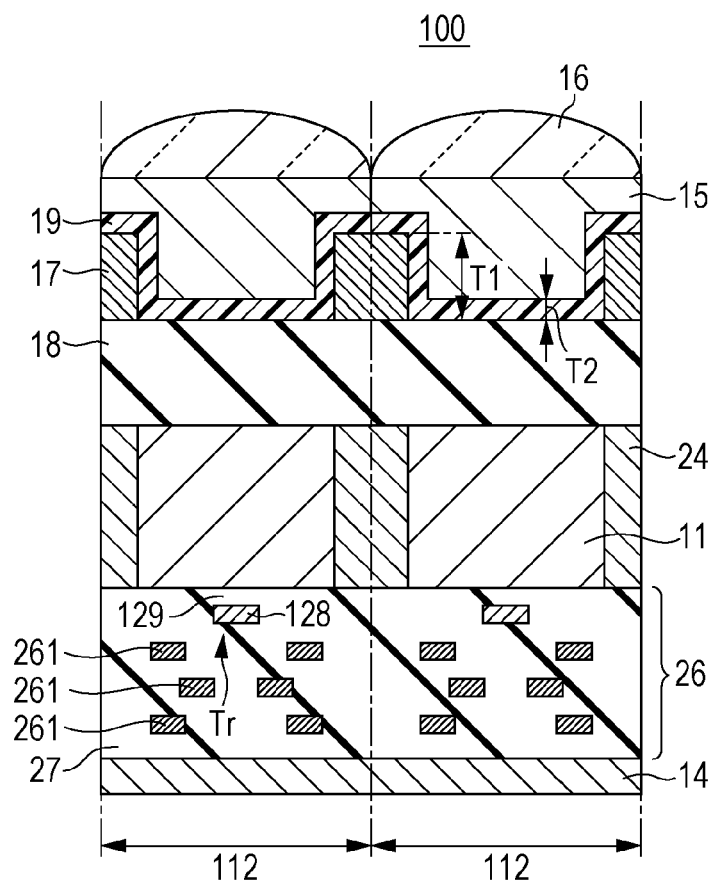
FIG. 2 is a cross-sectional view of the solid-state imaging device according to the first embodiment.

Referring now to FIG. 2, the solid-state imaging device 100 will be described in detail.

As shown in FIG. 2, the solid-state imaging device 100 according to the present embodiment includes a substrate 111, a wiring layer 26 formed on the front side of the substrate 111, a support substrate 14, color filters 15 formed on the back side of the substrate 111 with an insulator film 18 therebetween, and microlenses 16.

The substrate 111 is a semiconductor substrate made of silicon. The substrate 111 has a thickness of 3-5 μm. On the substrate 111, a plurality of pixels 112 each including a photoelectric conversion element 11 and a plurality of pixel transistors Tr forming a pixel circuit section are formed in a two-dimensional matrix. Although not shown in FIG. 2, peripheral circuit sections are formed in the peripheral regions of the pixels 112 formed on the substrate 111.

In the photoelectric conversion element 11, which is a photodiode, for example, a signal charge is generated and accumulated in accordance with the amount of light received from the incident light.

The pixel transistor Tr has a source/drain region (not shown) formed on the front side of the substrate 111 as well as a gate electrode 128 formed on the front side of the substrate 111 with a gate insulating film 129 therebetween.

An element separation region 24 including a high-concentration impurity region is formed between adjacent pixels 112, extending from the front side to the back side of the substrate 111. The pixels 112 are electrically separated from each other by the element separation region 24.

The wiring layer 26 is formed on the front side of the substrate 111 and has wirings 261 arranged in a plurality of layers (three layers in FIG. 2) with an interlayer insulator film 27 therebetween. The pixel transistor Tr forming part of the pixel 112 is driven through the wirings 261 formed in the wiring layer 26.

The support substrate 14 is formed on the surface of the wiring layer 26 opposite to the surface facing the substrate 111. The support substrate 14 is formed in order to ensure the strength of the substrate 111 in the manufacturing stage. The support substrate 14 is formed of a silicon substrate, for example.

The color filters 15 are formed on the back side of the substrate 111 with an insulator film 18 therebetween and include first, second, and third color filter components, for example, for each pixel. For example, the first, second, and third color filter components may be green, red, and blue filter components, respectively, but are not limited thereto and may be any color filter components. Instead of the color filter components, other filter components may be used such as transparent resins, for example, that transmit visible light or ND filters containing carbon black pigments in transparent resins to attenuate visible light.

Light with the desired wavelength is transmitted through the color filters 15 and enters the photoelectric conversion elements 11 in the substrate 111.

A light shielding film 17 is provided between the color filter components of the color filters 15. An adhesive film 19 is formed between the light shielding film 17 and the color filters 15 and between the insulator film 18 and the color filters 15.

The light shielding film 17 is provided in order to reduce color mixture caused by the leakage of incident light to the adjacent photoelectric conversion elements 11. The light shielding film 17 is formed of an electrically conductive material or an organic material with black color material scattered therein.

The adhesive film 19 is provided between the color filters 15 and the light shielding film 17 and between the color filters 15 and the insulator film 18 in order to adhere the color filters 15 to the light shielding film 17 and the insulator film 18. The adhesive film 19 is a nonplanarized transparent film with good adhesion to the color filters, oxide film, nitride film, and metal. Preferably, the adhesive film 19 is made of a thermoplastic resin material having thermal fluidity in a certain temperature region such that the irregularities of application thereof due to the rugged surface of the underlying layer (in this case, light shielding film 17 and insulator film 18) are reduced in a thermal effect process, as well as a thermosetting property in a final heat treatment process.

Examples of the above-mentioned resin material include organic films made of acrylic resin, phenolic resin, siloxane resin, or copolymer resin thereof, and epoxy resin, for example. More specifically, "TMR-0006" available from TOKYO OHKA KOGYO CO., LTD., Japan may be used, for example. Here, the case where epoxy resin is used as a curable group or a curing agent is included in this example. Further, as the adhesive film 19, an insulator film, which is mainly composed of silicon (Si), carbon (C), and hydrogen (H), such as an inorganic single film composed of SiCH, SiCOH, or SiCNH, for example may be used.

The adhesive film 19 is formed by making use of the shape of the light shielding film 17. More specifically, since the adhesive film 19 is deposited after the light shielding film 17 is formed, the adhesive film 19 is formed on the upper surface and side walls of the light shielding film 17.

It is favorable to form the adhesive film 19 in such thickness that at least part of the color filter 15 is formed to be positioned lower than the light shielding film 17 which is formed to correspond to each pixel. That is, the adhesive film 19 is formed to have the thickness T2 which satisfies T2<T1, where T1 is the film thickness of the light shielding film 17. Here, the adhesive film 19 may be formed by patterning and etching using lithography so as to cover only the upper surface and the side walls of the light shielding film 17.

Next, a method of manufacturing the solid-state imaging device 100 will be described. The method of manufacturing the solid-state imaging device 100 includes forming pixels 112 each having a photoelectric conversion element 11 for converting incident light to an electric signal, forming a light shielding film 17 to be disposed between a plurality of color filter components of color filters 15, depositing a nonplanarized adhesive film 19 on the light shielding film 17, forming the color filters 15 on the adhesive film 19 between the light shielding films 17, and forming on the color filters 15 microlenses 16 for converging incident light through the color filters 15 onto the photoelectric conversion elements 11.

Referring now to FIGS. 3A to 3F, the method of manufacturing the solid-state imaging device 100 will be described in detail. The steps of forming the pixels 112 are similar to those in the related art and therefore description thereof will be omitted.

Figure 3A:
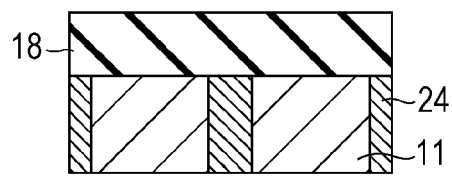
FIGS. 3A to 3F illustrate steps of manufacturing the solid-state imaging device according to the first embodiment.

As shown in FIG. 3A, an insulator film 18 is deposited on a photoelectric conversion element 11 using a CVD, ALD, or PVD method or the like.

Figure 3B:
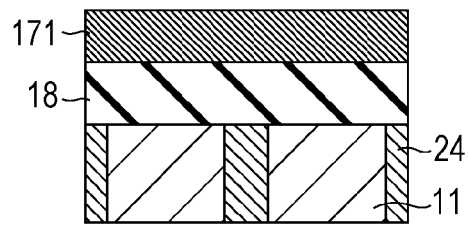
Figure 3C:
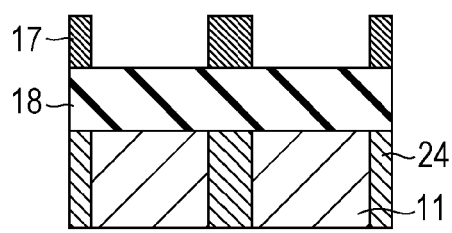

Next, a film 171 (in this case, metal) is deposited to form a light shielding film 17 (FIG. 3B). Subsequently, the film 171 is patterned by lithography to form in the film 171 apertures for pixels 112 and then etched to form the light shielding film 17 (FIG. 3C).

Figure 3D:
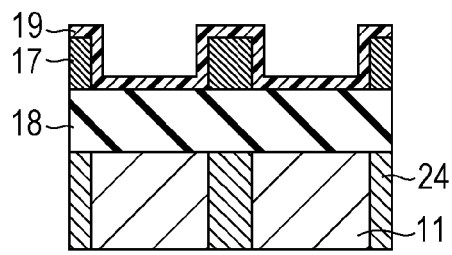
Figure 3E:
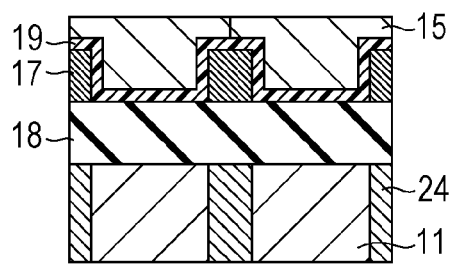

After the light shielding film 17 is formed as shown in FIG. 3D, an adhesive film 19 is deposited or applied using a spin coating process, spray coating process, slit coating process, or the like. Optically efficient color filters 15 with a thickness of approximately 100 nm to 1 μm are formed on the adhesive film 19 (FIG. 3E).

Figure 3F:
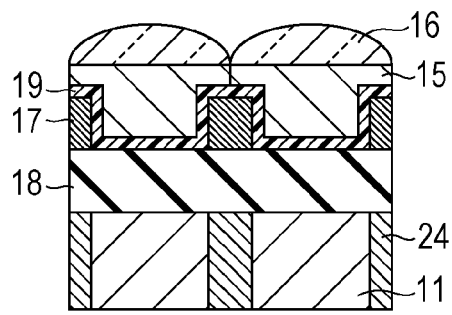

Microlenses 16 are formed on the color filters 15 (FIG. 3F).

In the solid-state imaging device 100 according to the present embodiment, the nonplanarized adhesive film 19 provided between the color filters 15 and light shielding films 17 as described above can suppress the detachment of color filters.

Further, part of the color filer 15 is embedded in the layer of the light shielding film 17, enabling reduction in height of the solid-state imaging device 100. Accordingly, reduction in color mixture and improvement of sensitivity can be realized in the solid-state imaging device 100. Further, the color filters 15 can be formed by self alignment in a manner to be based on the light shielding film 17 which is formed between pixels, enabling improvement of overlay accuracy between the light shielding film 19 and the color filters 15.

(Second Embodiment)

Next, a solid-state imaging device 200 according to a second embodiment will be described. Since the solid-state imaging device 200 has the same configuration as the solid-state imaging device 100 in FIG. 2 except for planarized color filters 25, the same components are denoted with the same reference characters and description thereof will be omitted.

Figure 4:
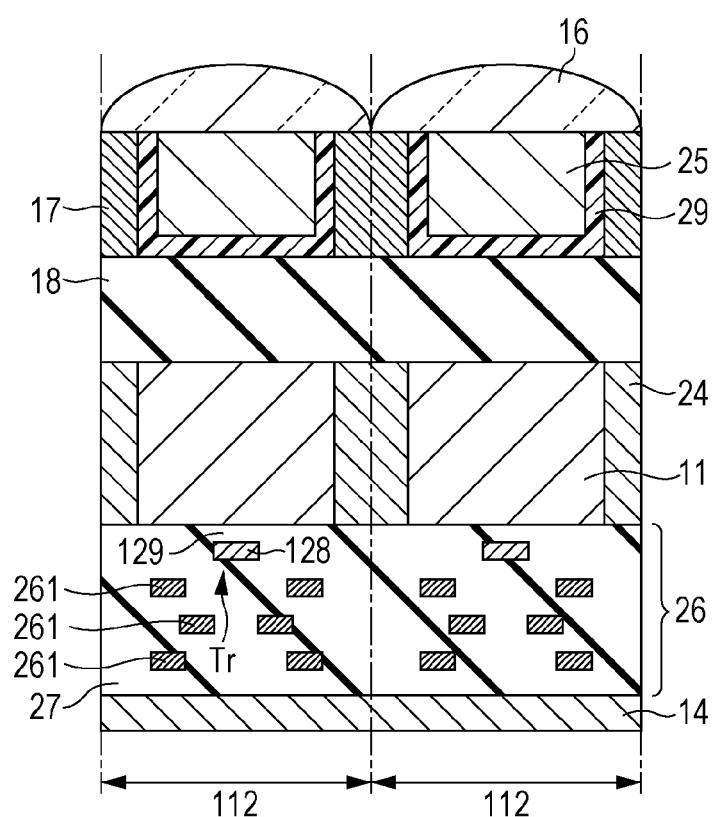
FIG. 4 is a cross-sectional view of a solid-state imaging device according to a second embodiment.

The solid-state imaging device 200 shown in FIG. 4 has color filters 25 disposed in the same layer as the light shielding film 17 as well as an adhesive film 29 formed on the side walls of the light shielding film 17 and on the insulator film 18.

The adhesive film 29 is formed between the light shielding film 17 and color filters 25. The adhesive film 29 is formed on the side walls of the light shielding film 17 but not formed on one surface orthogonal to the side walls of the light shielding film 17. The adhesive film 29 is also formed on the insulator film 18. The adhesive film 29 is the same as the adhesive film 19 in FIG. 2 in terms of its structure and material, except for its shape.

The color filters 25 are planarized and formed in the same layer as the light shielding films 17.

The solid-state imaging device 200 has the adhesive film 29 and color filters 25 sequentially formed in the apertures formed by the light shielding film 17 and insulator film 18. The adhesive film 29 is formed not only between the color filters 25 and insulator film 18 but also between the side walls of the light shielding film 17 and the color filters 25.

Next, a method of manufacturing the solid-state imaging device 200 will be described. The steps until the color filters 25 are formed are the same as those in FIGS. 3A to 3E and therefore description thereof will be omitted.

In FIGS. 3A to 3F, the color filters 15 are formed before the microlenses 16 are formed. Instead, in the present embodiment, the color filters 25 are formed and planarized before the microlenses 16 are formed, as shown in FIGS. 5A and 5B.

Figure 5A:
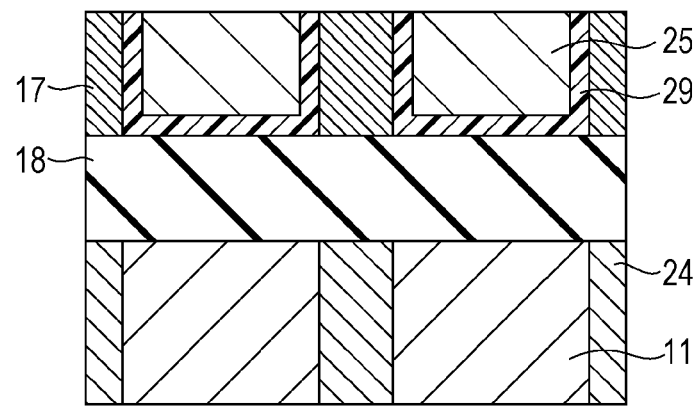
FIGS. 5A and 5B illustrate steps of manufacturing the solid-state imaging device according to the second embodiment.

As shown in FIG. 5A, after the color filters 25 are formed, the color filters 25 are planarized by CMP, dry etching, or the like. Here, the color filters 25 are planarized until the surfaces of the light shielding film 17 are exposed. The adhesive film 29 formed on one surface of the light shielding film 17 is also etched accordingly. Alternatively, etching may be stopped when the adhesive films 29 is still left. In this case, the adhesive film 29 would be formed on the side walls of the light shielding film 17 and on the insulator film 18.

Figure 5B:
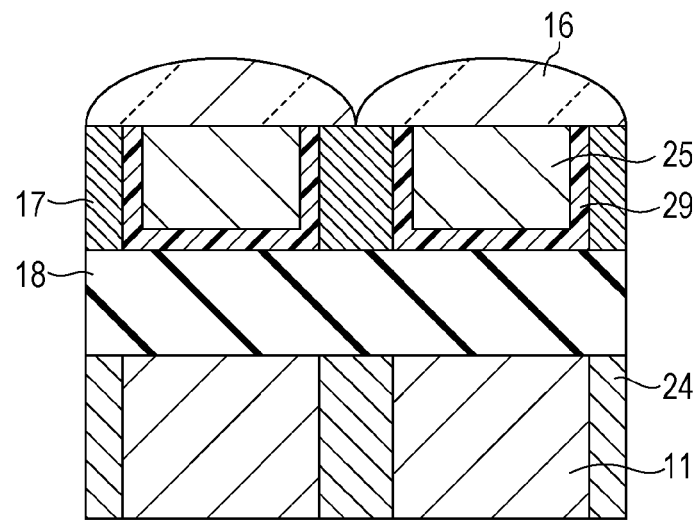

As shown in FIG. 5B, after the color filters 25 are planarized, microlens 16 are formed on the color filters 25.

As described above, the solid-state imaging device 200 according to the present embodiment can improve image quality with an improved irregularity/shading/sensitivity ratio because of the planarized color filters 25, and can suppress the detachment of color filters by the adhesive film 29 provided between the color filters 25 and the light shielding film 17 and between the color filters 25 and the insulator film 18. Further, the color filters 25 are embedded in the layer of the light shielding film 17, enabling reduction in height of the solid-state imaging device 200. Further, the color filters 25 can be formed by self alignment in a manner to be based on the light shielding film 17 which is formed between pixels, enabling improvement of overlay accuracy between the light shielding film 17 and the color filters 25.

(Third Embodiment)

Next, a solid-state imaging device 300 according to a third embodiment will be described. Since the solid-state imaging device 300 has the same configuration as the solid-state imaging device 100 in FIG. 2 except for the shape of an adhesive film 39, the same components are denoted with the same reference characters and description thereof will be omitted.

Figure 6:
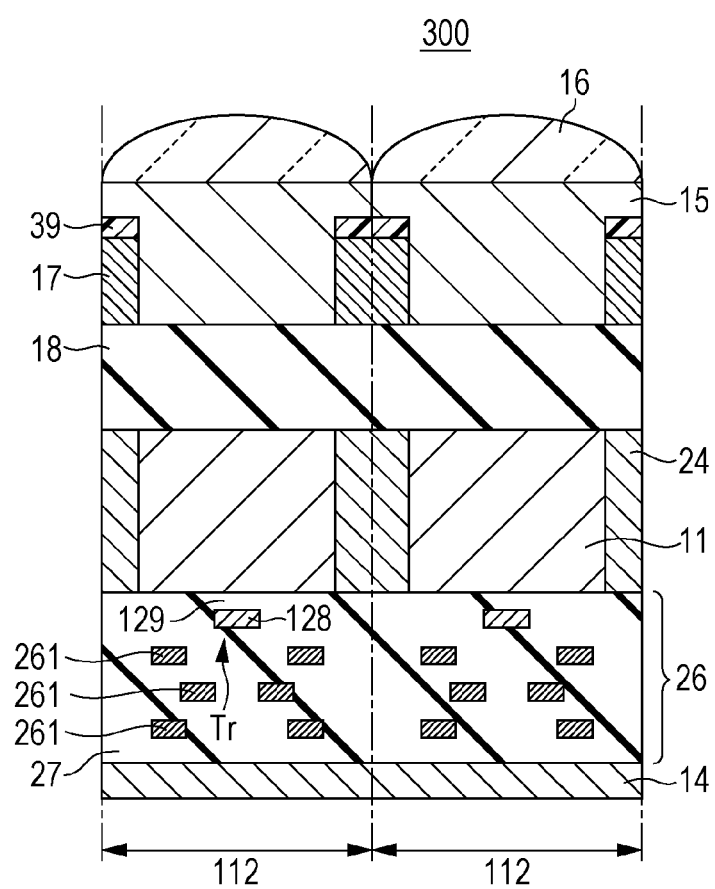
FIG. 6 is a cross-sectional view of a solid-state imaging device according to a third embodiment.

The solid-state imaging device 300 shown in FIG. 6 has an adhesive film 39 formed between one surface of the light shielding film 17 and the color filters 15.

The adhesive film 39 is formed on a part of the light shielding film 17, i.e., on one surface thereof in this embodiment, but not formed on the side walls of the light shielding film 17 and on the insulator film 18. The material and other features of the adhesive film 39 are the same as those of the adhesive film 19 shown in FIG. 2 and therefore description thereof will be omitted.

Next, a method of manufacturing the solid-state imaging device 300 will be described. The steps until the film 171 is formed are the same as those in FIGS. 3A and 3B and therefore description thereof will be omitted.

Figure 7A:
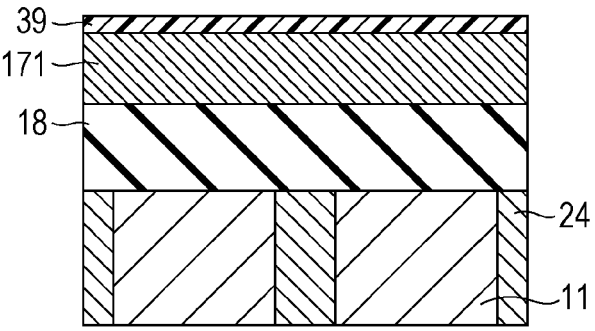
FIGS. 7A to 7D illustrate steps of manufacturing the solid-state imaging device according to the third embodiment.
Figure 7B:
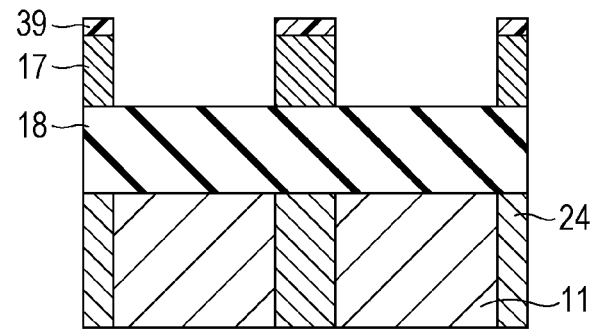

After the film 171 is formed, the adhesive film 39 is deposited on the film 171 as shown in FIG. 7A. Subsequently, the film 171 is patterned by lithography to form in the film 171 apertures for pixels 112 and then the film 171 and the adhesive film 39 are etched to form a light shielding film 17 and the adhesive film 39 (FIG. 7B).

Figure 7C:
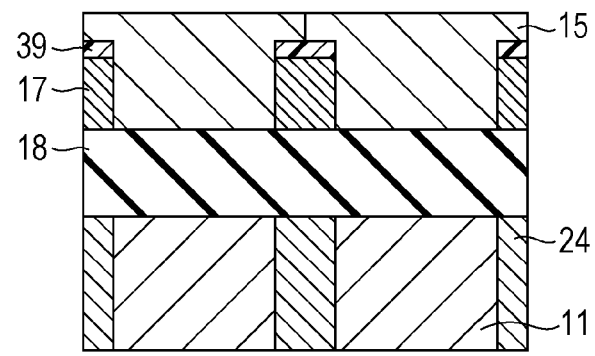
Figure 7D:
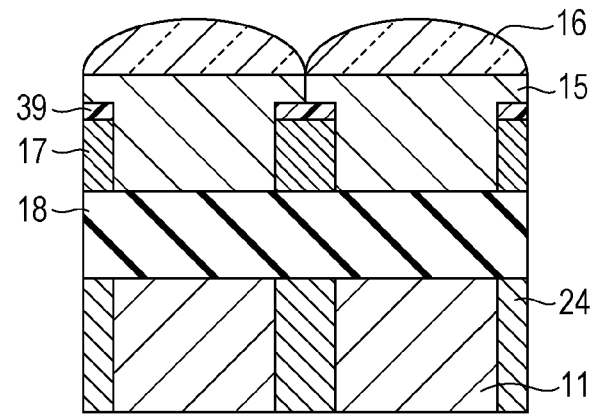

Next, color filters 15 are formed (FIG. 7C) and microlenses 16 are formed on the color filters 15 (FIG. 7D).

Since the adhesive film 39 is not provided between the insulator film 18 and the color filters 15 as described above, the solid-state imaging device 300 according to the present embodiment can be reduced in height compared with the solid-state imaging device 100 shown in FIG. 2. With this, the solid-state imaging device 300 can achieve the reduction in color mixture and improve the sensitivity. The adhesive film 39 provided between one surface of the light shielding film 17 and the color filters 15 can suppress the detachment of color filters. Further, the color filters 15 can be formed by self alignment in a manner to be based on the light shielding film 17 which is formed between pixels, enabling improvement of overlay accuracy between the light shielding film 17 and the color filters 15.

The solid-state imaging device 300 according to the present embodiment is particularly useful when the adhesion of the light shielding film 17 to the color filters 15 is inferior to the adhesion of the insulator film 18 to the color filters 15.

(Fourth Embodiment)

Next, a solid-state imaging device 400 according to a fourth embodiment will be described. Since the solid-state imaging device 400 has the same configuration as the solid-state imaging device 100 in FIG. 2 except for the shape of an insulation film 48, the same components are denoted with the same reference characters and description thereof will be omitted.

Figure 8:
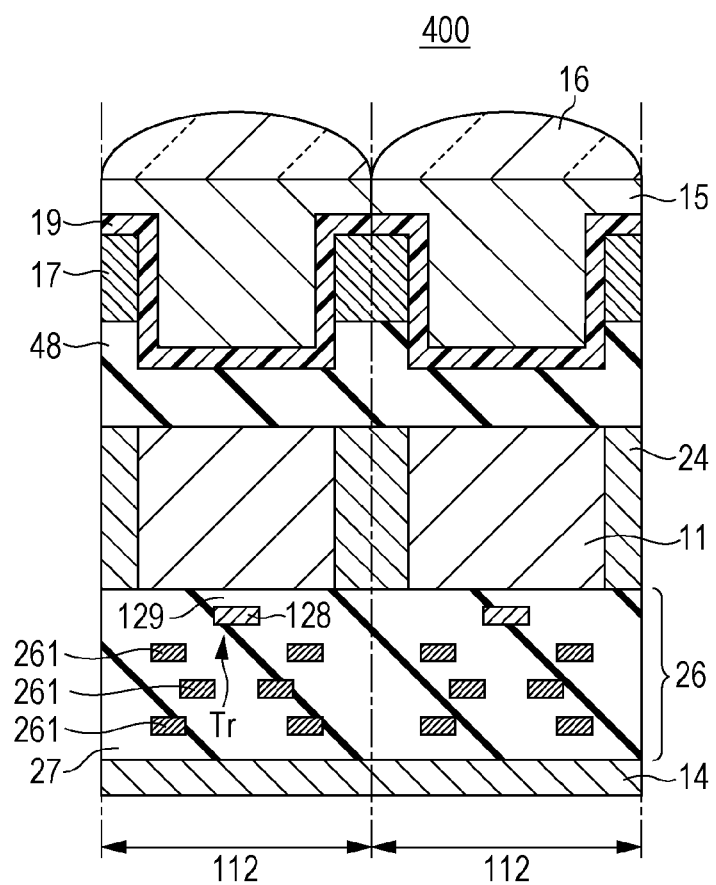
FIG. 8 is a cross-sectional view of a solid-state imaging device according to a fourth embodiment.

As shown in FIG. 8, the solid-state imaging device 400 includes the insulator film 48 with recesses.

The insulator film 48 has projections and recesses on one surface. A light shielding film 17 is formed on the projections and an adhesive film 19 and color filters 15 are formed in the recesses. Thus, the solid-state imaging device 400 has the adhesive film 19 and the color filters 15 embedded in the insulator film 48.

Next, a method of manufacturing the solid-state imaging device 400 will be described. The steps until the film 171 is formed are the same as those in FIGS. 3A and 3B and therefore description thereof will be omitted.

Figure 9A:
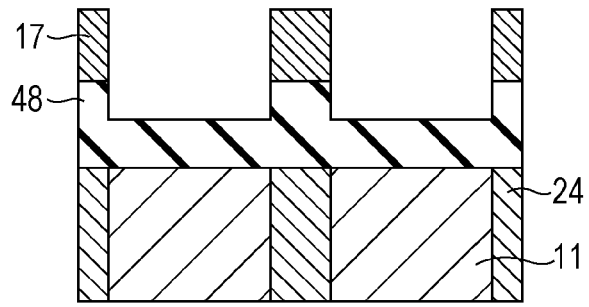
FIGS. 9A to 9D illustrate steps of manufacturing the solid-state imaging device according to the fourth embodiment.

After the film 171 is formed, the film 171 is patterned by lithography to form in the film 171 apertures for pixels 112 and then the film 171 and the insulator film 48 are etched as shown in FIG. 9A. The total etching depth of the light shielding film 17 and insulator film 48 is approximately 100 nm to 1 μm. In this manner, the light shielding film 17 and the insulator film 48 with recesses are formed.

Figure 9B:
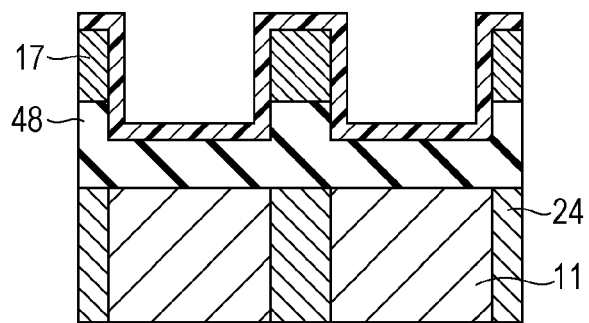
Figure 9C:
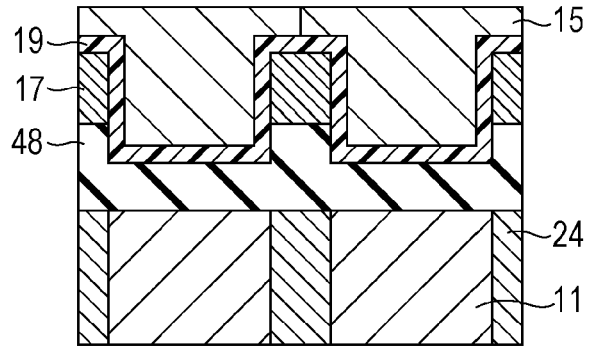
Figure 9D:
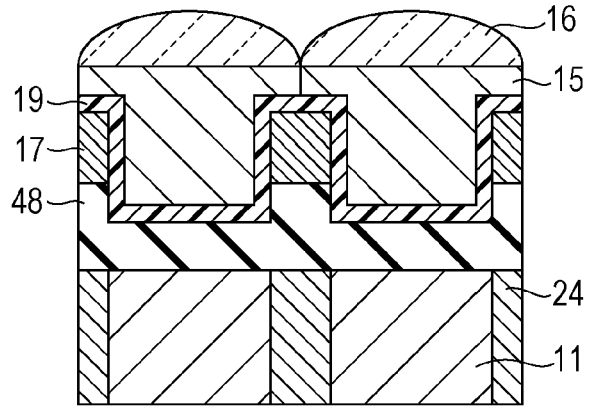

After the light shielding film 17 is formed, an adhesive film 19 is deposited or applied using a spin coating process, spray coating process, slit coating process, or the like as shown in FIG. 9B. Then, color filters 15 having a thickness of approximately 100 nm to 1 μm are formed (FIG. 9C) and microlenses 16 are formed on the color filters 15 (FIG. 9D).

As described above, the solid-state imaging device 400 according to the present embodiment has the insulator film 48 with recesses and the color filters 15 embedded within the recesses. This allows the solid-state imaging device 400 to be reduced in height while retaining the desired thickness of the color filters 15 without increasing the thickness of the light shielding film 17. With this, the solid-state imaging device 400 can achieve the reduction in color mixture and improve the sensitivity. The adhesive film 19 provided between the light shielding film 17 and the color filters 15 can suppress the detachment of color filters 15. Further, the color filters 15 can be formed by self alignment in a manner to be based on the light shielding film 17 which is formed between pixels, enabling improvement of overlay accuracy between the light shielding film 17 and the color filters 15.

To etch the insulator film 48 in FIG. 9A, isotropic etching may be used to form rounded recesses in the insulator film 48. In this case, the optical waveguide formed by the light shielding film 17 and adhesive film 19 would form a convex lens projecting downward in the lower portion thereof which allows the incident light from the microlens 16 to be further converged.

(Fifth Embodiment)

Next, a solid-state imaging device 500 according to a fifth embodiment will be described. Since the solid-state imaging device 500 has the same configuration as the solid-state imaging device 400 in FIG. 8 except for a planarized color filter 25, the same components will be denoted with the same reference characters and description thereof will be omitted.

Figure 10:
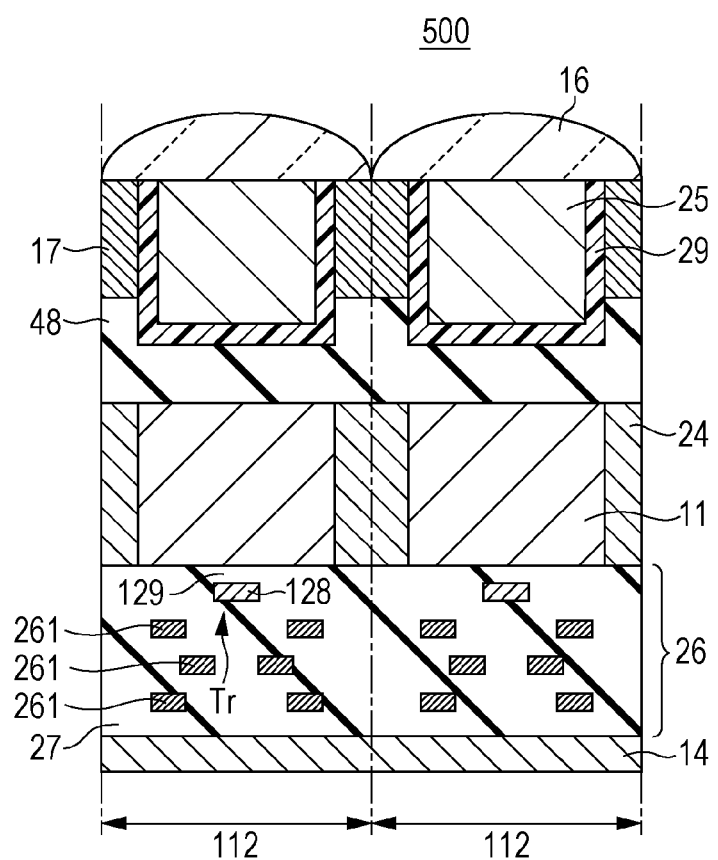
FIG. 10 is a cross-sectional view of a solid-state imaging device according to a fifth embodiment.

The solid-state imaging device 500 shown in FIG. 10 has color filters 25 disposed in the same layer as the light shielding film 17 and an adhesive film 29 formed on the side walls of the light shielding film 17 and on the insulator film 18.

The adhesive film 29 is formed between the light shielding films 17 and color filters 25. The adhesive film 29 is formed on the side walls of the light shielding film 17 but not formed on one surface orthogonal to the side walls of the light shielding film 17. The adhesive film 29 is also formed on the insulator film 18. The adhesive film 29 is the same as the adhesive film 19 in FIG. 2 in terms of its structure and material, except for its shape.

The color filters 25 are planarized and formed in the same layer as the light shielding films 17.

The solid-state imaging device 500 has the adhesive film 29 and the color filters 25 sequentially formed in the apertures formed by the light shielding film 17 and insulator film 18. The adhesive film 29 is formed not only between the color filters 25 and insulator film 18 but also between the side walls of the light shielding film 17 and the color filters 25.

Next, a method of manufacturing the solid-state imaging device 500 will be described. The steps until the color filters 25 are formed are the same as those in FIGS. 9A to 9C and therefore description thereof will be omitted.

In FIGS. 9A to 9D, after the color filters 15 are formed, the microlenses 16 are formed. Instead, in the present embodiment, the color filters 25 are formed and planarized before the microlenses 16 are formed as shown in FIGS. 11A and 11B.

Figure 11A:
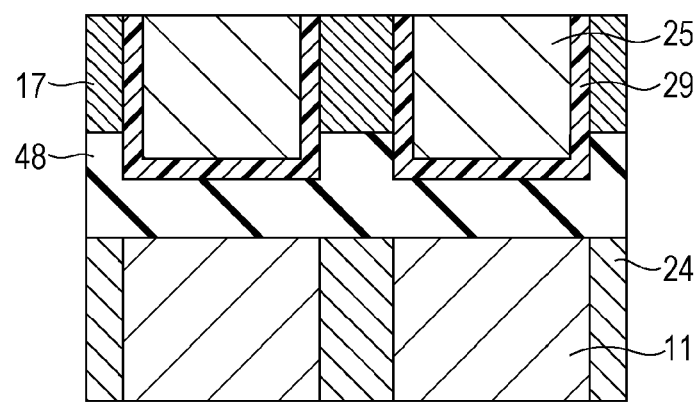
FIGS. 11A and 11B illustrate steps of manufacturing the solid-state imaging device according to the fifth embodiment.

As shown in FIG. 11A, after the color filters 25 are formed, the color filters 25 are planarized by CMP, dry etching, or the like. Here, the color filters 25 are planarized until the surfaces of the light shielding film 17 are exposed as shown in FIG. 11A. The adhesive film 29 formed on one surface of the light shielding film 17 are also etched accordingly. Alternatively, etching may be stopped when the adhesive film 29 is still left. In this case, the adhesive film 29 would be formed on the side walls of the light shielding film 17 and on the insulator film 18.

Figure 11B:
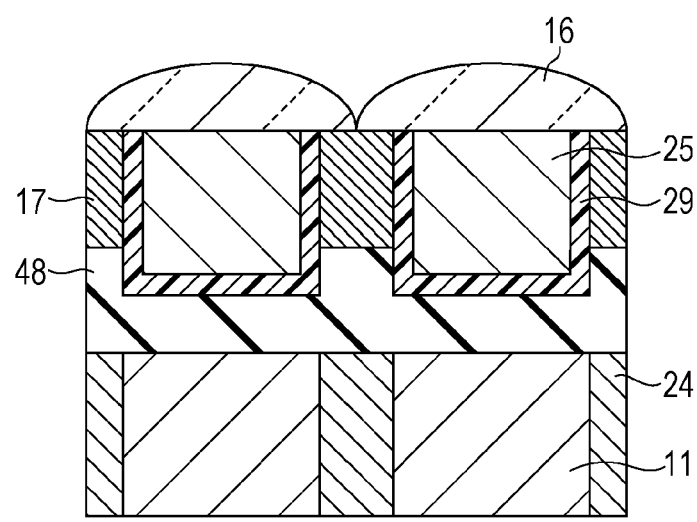

As shown in FIG. 11B, after the color filters 25 are planarized, microlens 16 are formed on the color filters 25.

As described above, the solid-state imaging device 500 according to the present embodiment can improve image quality with an improved irregularity/shading/sensitivity ratio, etc., because of the planarized color filters 25, and can suppress the detachment of color filters by the adhesive film 29 provided between the color filters 25 and the light shielding film 17 and between the color filters 25 and the insulator film 18. Further, the color filters 25 can be formed by self alignment in a manner to be based on the light shielding film 17 which is formed between pixels, enabling improvement of overlay accuracy between the light shielding film 17 and the color filters 25.

(Sixth Embodiment)

Next, a solid-state imaging device 600 according to a sixth embodiment will be described. Since the solid-state imaging device 600 has the same configuration as the solid-state imaging device 400 in FIG. 8 except for the shape of the adhesive film 39, the same components are denoted with the same reference characters and description thereof will be omitted.

Figure 12:
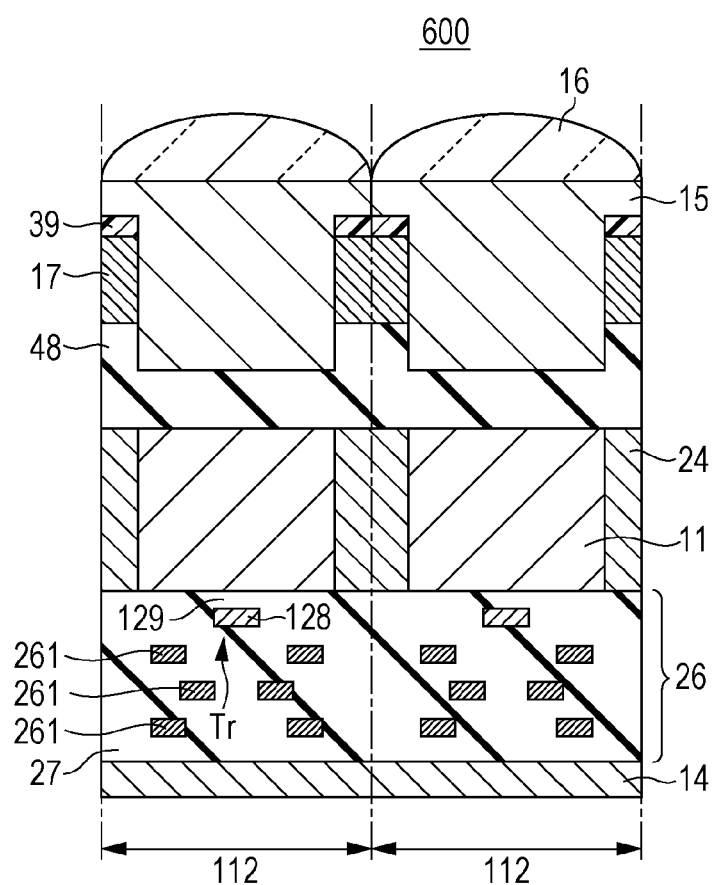
FIG. 12 is a cross-sectional view of a solid-state imaging device according to a sixth embodiment.

The solid-state imaging device 600 shown in FIG. 12 has an adhesive film 39 formed between one surface of the light shielding film 17 and the color filters 15.

The adhesive film 39 is formed on a part of the light shielding film 17, i.e., on one surface thereof in the present embodiment, but not formed on the side walls of the light shielding film 17 and on the insulator film 18. The material and other features of the adhesive film 39 are the same as those of the adhesive film 19 shown in FIG. 2 and therefore description thereof will be omitted.

Next, a method of manufacturing the solid-state imaging device 600 will be described. The steps until the adhesive film 39 is deposited on the film 171 are the same as those up to the step shown in FIG. 7A and therefore description thereof will be omitted.

Figure 13A:
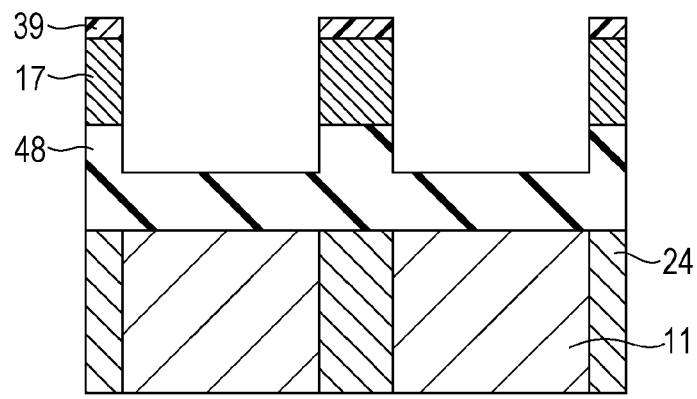
FIGS. 13A to 13C illustrate steps of manufacturing the solid-state imaging device according to the sixth embodiment.
Figure 13B:
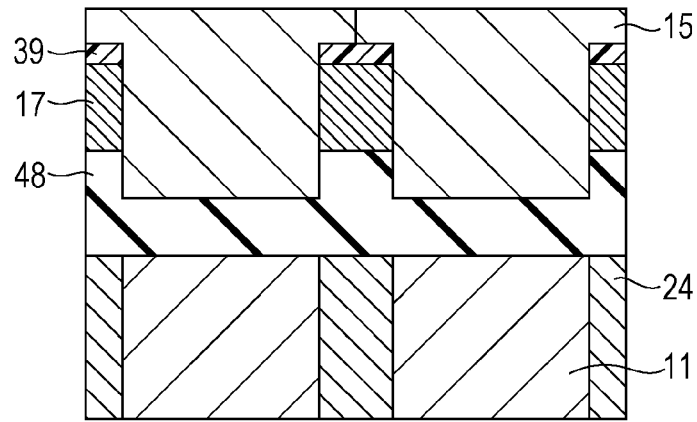
Figure 13C:
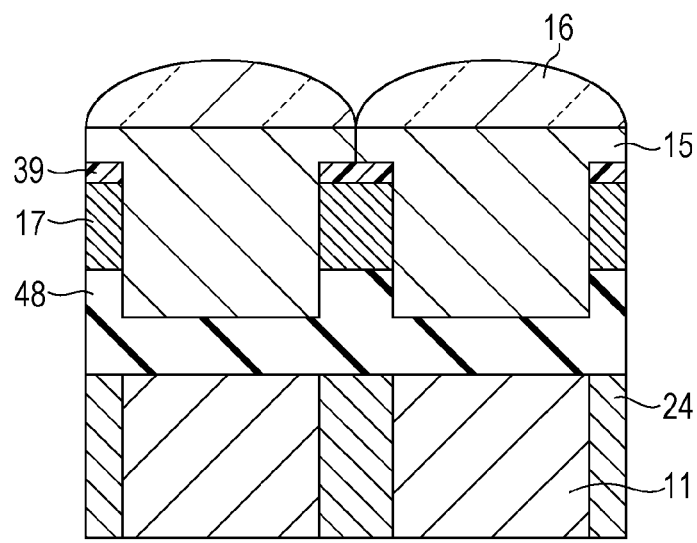

After the adhesive film 39 is formed, the film 171 is patterned by lithography to form in the film 171 apertures for pixels 112 and then the film 171 and the insulator film 48 are etched as shown in FIG. 13A. Then, color filters 15 having a thickness of approximately 100 nm to 1 μm are formed (FIG. 13B) and microlenses 16 are formed on the color filters 15 (FIG. 13C).

Since the adhesive film 39 is not provided between the insulator film 18 and the color filters 15 as described above, the solid-state imaging device 600 according to the present embodiment can be reduced in height compared with the solid-state imaging device 400 shown in FIG. 8. With this, the solid-state imaging device 600 can achieve the reduction in color mixture and improve the sensitivity. The adhesive film 39 provided between one surface of the light shielding film 17 and the color filters 15 can suppress the detachment of color filters. Further, the color filters 15 can be formed by self alignment in a manner to be based on the light shielding film 17 which is formed between pixels, enabling improvement of overlay accuracy between the light shielding film 17 and the color filters 15.

The solid-state imaging device 600 according to the present embodiment is particularly useful when the adhesion of the light shielding films 17 to the color filters 15 is inferior to the adhesion of the insulator film 18 to the color filters 15.

(Seventh Embodiment)

Next, a solid-state imaging device 700 according to a seventh embodiment will be described.

Figure 14:
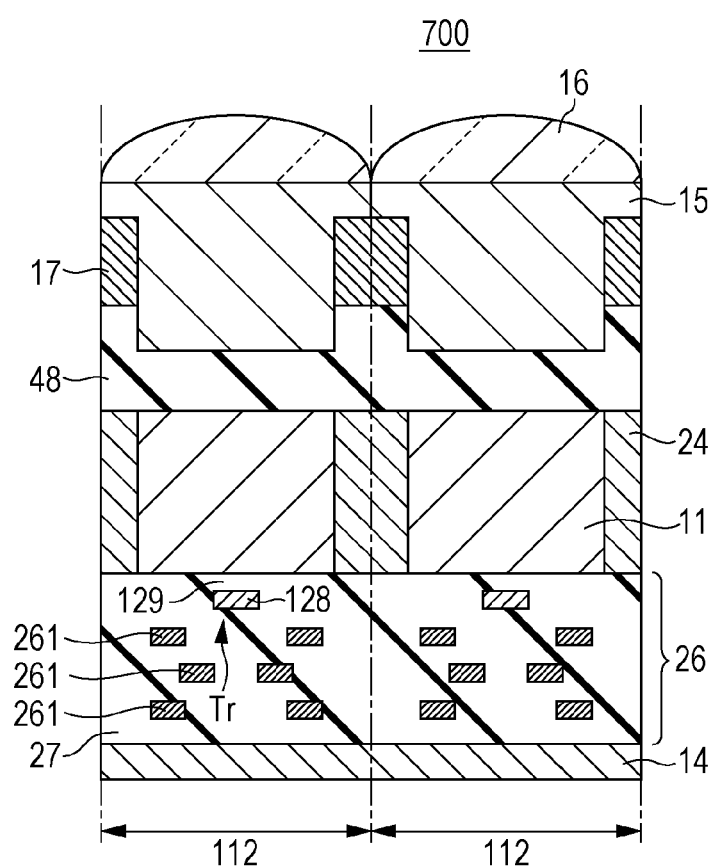
FIG. 14 is a cross-sectional view of a solid-state imaging device according to a seventh embodiment.

As shown in FIG. 14, the solid-state imaging device 700 has pixels 112 each having a photoelectric conversion element 11 for converting incident light to an electric signal, color filters 15 associated with the pixels 112 and having a plurality of color filter components, microlenses 16 for converging the incident light through the color filters 15 onto the photoelectric conversion elements 11, and a light shielding film 17 provided on the insulator film 48 between the color filter components of the color filters 15 embedded in the insulator film 48.

As the insulator film 48, a material having a high adhesion to the color filters 15 is selected.

Since the solid-state imaging device 700 has the same configuration as the solid-state imaging device 400 in FIG. 8 except for the lack of the adhesive film 19, the same components are denoted with the same reference characters and description thereof will be omitted.

Next, a method of manufacturing the solid-state imaging device 700 will be described. The steps until the light shielding film 17 and insulator film 48 are formed by etching the film 171 and insulator film 48 are the same as those up to the step shown in FIG. 9A and therefore description thereof will be omitted.

Figure 15A:
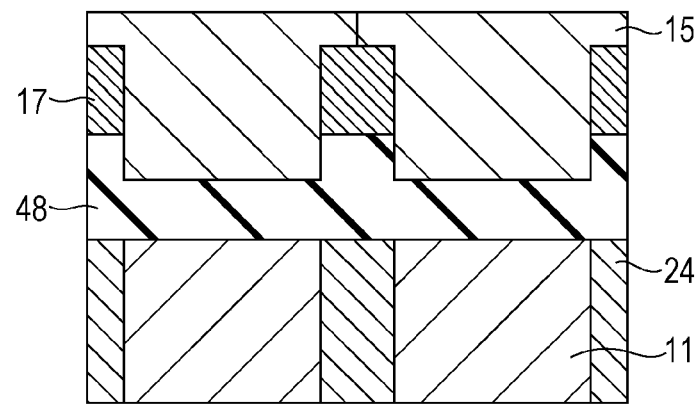
FIGS. 15A and 15B illustrate steps of manufacturing the solid-state imaging device according to the seventh embodiment.
Figure 15B:
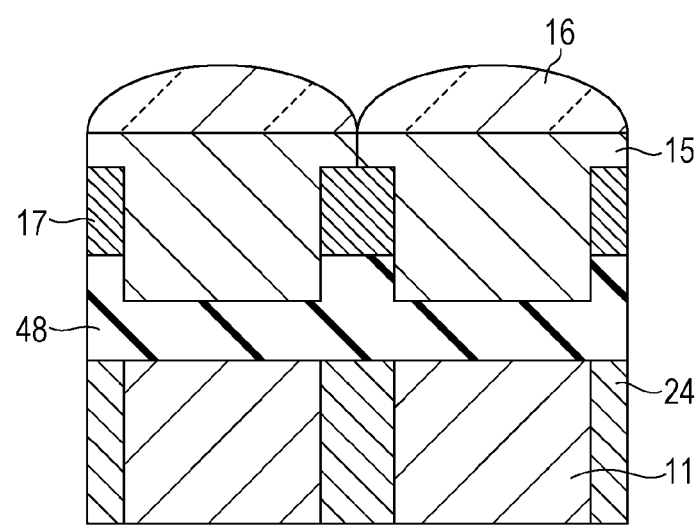

After the light shielding film 17 is formed, color filters 15 having a thickness of approximately 100 nm to 1 μm are formed as shown in FIG. 15A without any adhesive film therebetween. Next, microlenses 16 are formed on the color filters 15 as shown in FIG. 15B.

As described above, the solid-state imaging device 700 according to the present embodiment has the insulator film 48 with recesses for embedding the color filters 15 therein. Selecting as the insulator film 48 a material having a high adhesion to the color filters 15 can further improve the adhesion of the insulator film 48 to the color filters 15 and thus suppress the detachment of color filters 15.

Embedding the color filters 15 in the insulator film 48 allows the solid-state imaging device 400 to be reduced in height while retaining the desired thickness of the color filters 15 without increasing the thickness of the light shielding film 17. With this, the solid-state imaging device 400 can achieve the reduction in color mixture and improve the sensitivity. Further, the color filters 15 can be formed by self alignment in a manner to be based on the light shielding film 17 which is formed between pixels, enabling improvement of overlay accuracy between the light shielding film 17 and the color filters 15.

(Eighth Embodiment)

Next, a solid-state imaging device 800 according to an eighth embodiment will be described. Since the solid-state imaging device 800 has the same configuration as the solid-state imaging device 700 in FIG. 14 except for a planarized color filter 25, the same components are denoted with the same reference characters and description thereof will be omitted.

Figure 16:
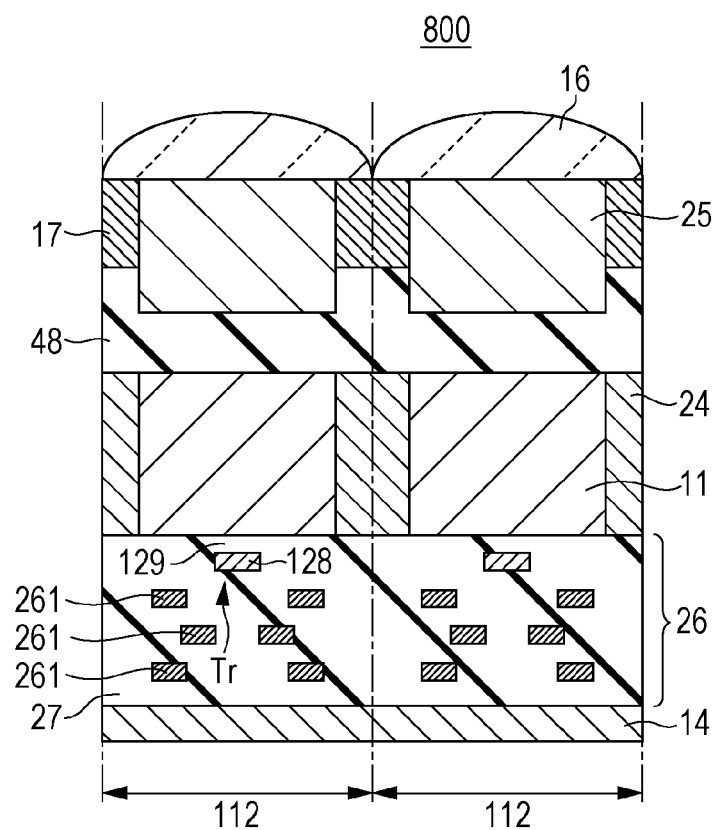
FIG. 16 is a cross-sectional view of a solid-state imaging device according to an eighth embodiment.

The solid-state imaging device 800 shown in FIG. 16 has color filters 25 disposed in the same layer as the light shielding film 17.

Next, a method of manufacturing the solid-state imaging device 800 will be described. The steps until the color filters 25 are formed are the same as those up to the step shown in FIG. 15A and therefore description thereof will be omitted.

In FIGS. 15A and 15B, after the color filters 15 are formed, the microlenses 16 are formed. Instead, in the present embodiment, the color filters 25 are formed and planarized before the microlenses 16 are formed as shown in FIGS. 17A and 17B.

Figure 17A:
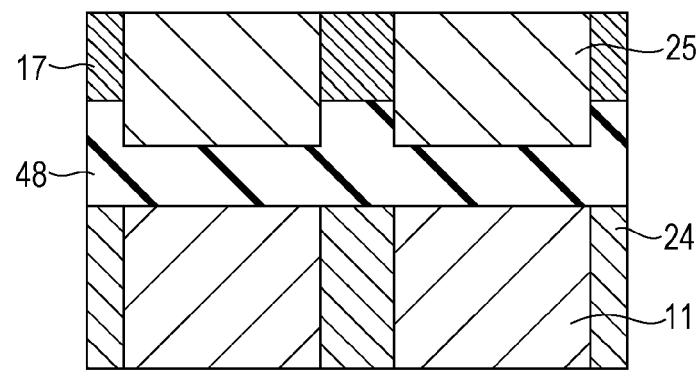
FIGS. 17A and 17B illustrate steps of manufacturing the solid-state imaging device according to the eighth embodiment.

As shown in FIG. 17A, after the color filters 25 are formed, the color filters 25 are planarized by CMP, dry etching, or the like. Here, the color filters 25 are planarized until the surfaces of the light shielding film 17 are exposed.

Figure 17B:
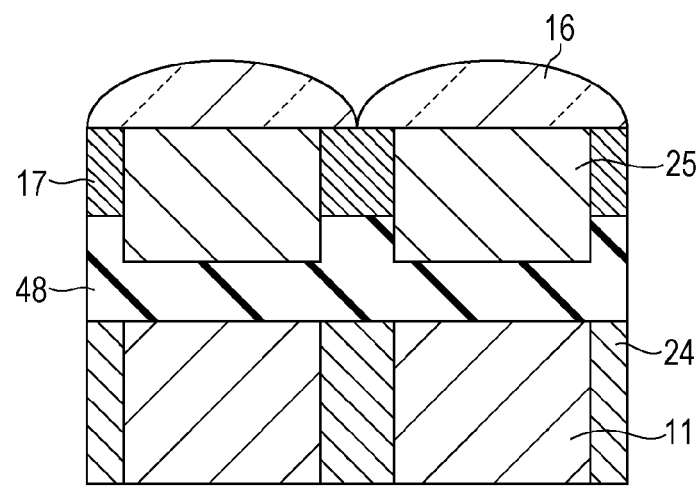

After the color filters 25 are planarized, microlenses 16 are formed on the color filters 25 as shown in FIG. 17B.

The solid-state imaging device 800 according to the present embodiment has the planarized color filters 25 as described above and can therefore improve an irregularity/shading/sensitivity ratio, etc., and consequently improve image quality. The solid-state imaging device 800 has also recesses formed in the insulator film 48 for embedding the color filters 25. Selecting as the insulator film 48 a material having a high adhesion to the color filters 25 can further improve the adhesion of the insulator film 48 to the color filters 25 and thereby suppress the detachment of color filters 25. Further, the color filters 25 can be formed by self alignment in a manner to be based on the light shielding film 17 which is formed between pixels, enabling improvement of overlay accuracy between the light shielding film 17 and the color filters 25.

(Ninth Embodiment)

Next, a solid-state imaging device 900 according to a ninth embodiment will be described. Since the solid-state imaging device 900 has the same configuration as the solid-state imaging device 100 in FIG. 2 except for an oxide film 40 provided between the adhesive film 19 and light shielding film 17, the same components are denoted with the same reference characters and description thereof will be omitted.

Figure 18:
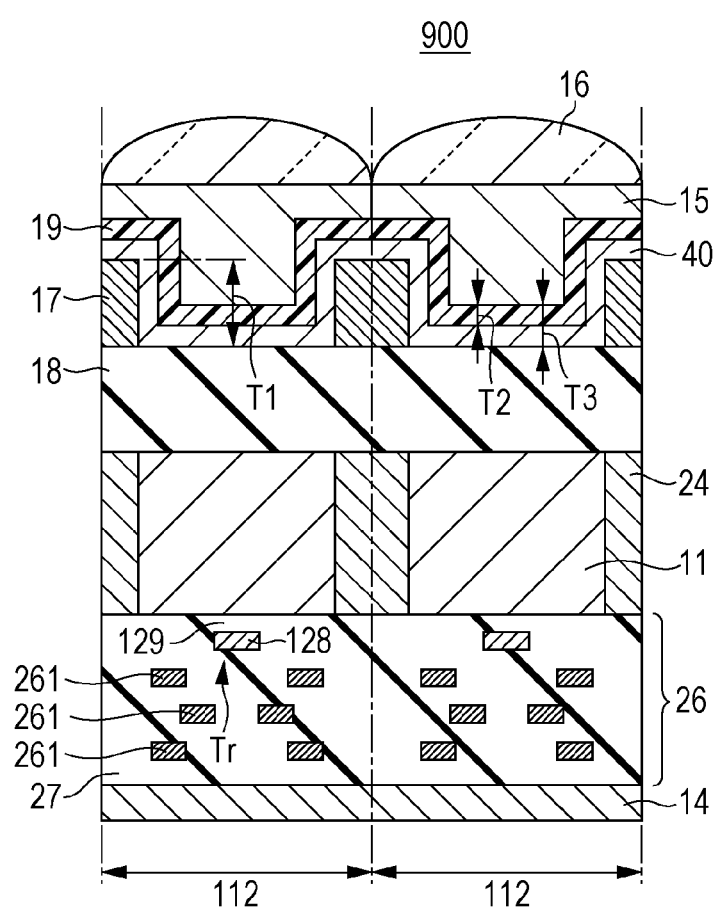
FIG. 18 is a cross-sectional view of a solid-state imaging device according to a ninth embodiment.

As shown in FIG. 18, the solid-state imaging device 900 has the oxide film 40 formed on surfaces (one surface and side walls) of the light shielding film 17 and on the insulator film 18. An adhesive film 19 is deposited on the oxide film 40. The adhesive film 19 is formed from a material having good adhesion to the oxide film 40. It is favorable to form the oxide film 40 and the adhesive film 19 in such thicknesses that at least part of the color filter 15 is formed to be positioned lower than the light shielding film 17 which is formed to correspond to each pixel. That is, the oxide film 40 and the adhesive film 19 are formed such that the total film thickness T3 of the oxide film 40 and the adhesive film 19 satisfies T3<T1, where T1 is the film thickness of the light shielding film 17.

Examples of the material of the oxide film 40 include a $SiO_2$ film, a P-SiO film, a HDP-SiO film, and the like which are formed by using at least any material gas made of silicon hydroxide ($Si_nH_{2n+2}$), alkylsilane ($SiH_nR_{4-n}$, $SiR_4$), alkoxysilane ($SiH_n(OR)_{4-n}$, $Si(OR)_4$, $Si(OR)_2(OR')_2$), or polysiloxane, and an oxidizing agent. Instead of the oxide film 40, a nitride film may be employed.

Here, the oxide film 40 and the adhesive film 19 may be formed by patterning and etching using lithography so as to cover only the upper surface and the side walls of the light shielding film 17.

Next, a method of manufacturing the solid-state imaging device 900 will be described. The steps until the light shielding film 17 is formed are the same as those in FIGS. 3A to 3C and therefore description thereof will be omitted.

Figure 19A:
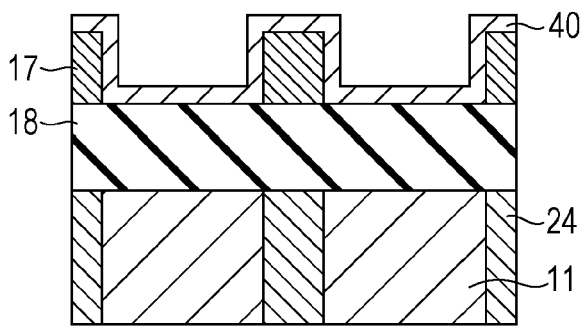
FIGS. 19A to 19D illustrate steps of manufacturing the solid-state imaging device according to the ninth embodiment.
Figure 19B:
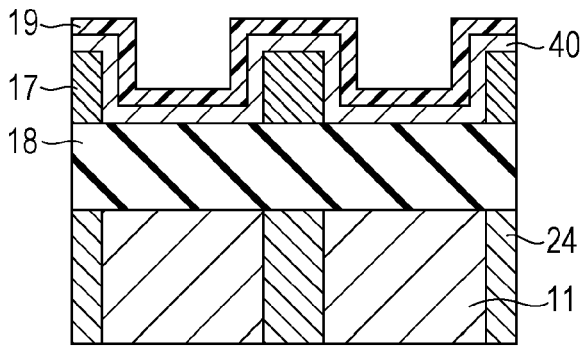
Figure 19C:
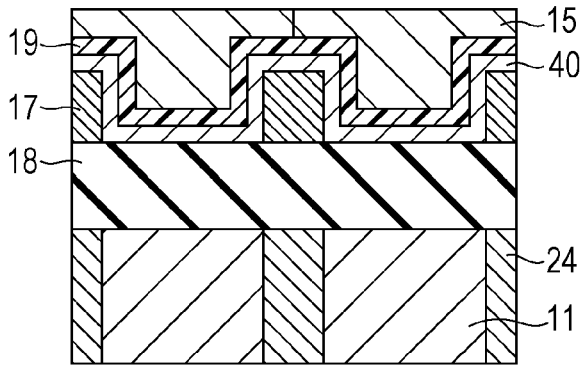
Figure 19D:
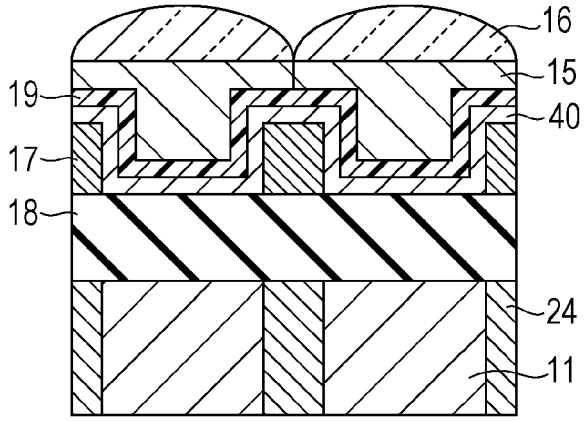

As shown in FIG. 19A, after the light shielding film 17 is formed, an oxide film 40 is deposited or applied using a spin coating process, spray coating process, slit coating process, or the like. Next, an adhesive film 19 is deposited on the oxide film 40 using a spray coating process, slit coating process, or the like (FIG. 19B). Next, color filters 15 are formed on the adhesive film 19 (FIG. 19C) and microlenses 16 are formed on the color filters 15 (FIG. 19D).

As described above, the adhesive film 19 can be deposited on the oxide film 40 as in the solid-state imaging device 900 according to the present embodiment. In spite of the oxide film 40 thus formed, the detachment of color filters can be suppressed because the adhesive film 19 and oxide film 40 are formed between the color filters 15 and the light shielding film 17. Further, the color filters 15 can be formed by self alignment in a manner to be based on the light shielding film 17 which is formed between pixels, enabling improvement of overlay accuracy between the light shielding film 17 and the color filters 15.

(Tenth Embodiment)

Next, a solid-state imaging device 1000 according to a tenth embodiment will be described. Since the solid-state imaging device 1000 has the same configuration as the solid-state imaging device 900 in FIG. 18 except for an oxide film 50 formed on one surface of the light shielding film 17, the same components are denoted with the same reference characters and description thereof will be omitted.

Figure 20:
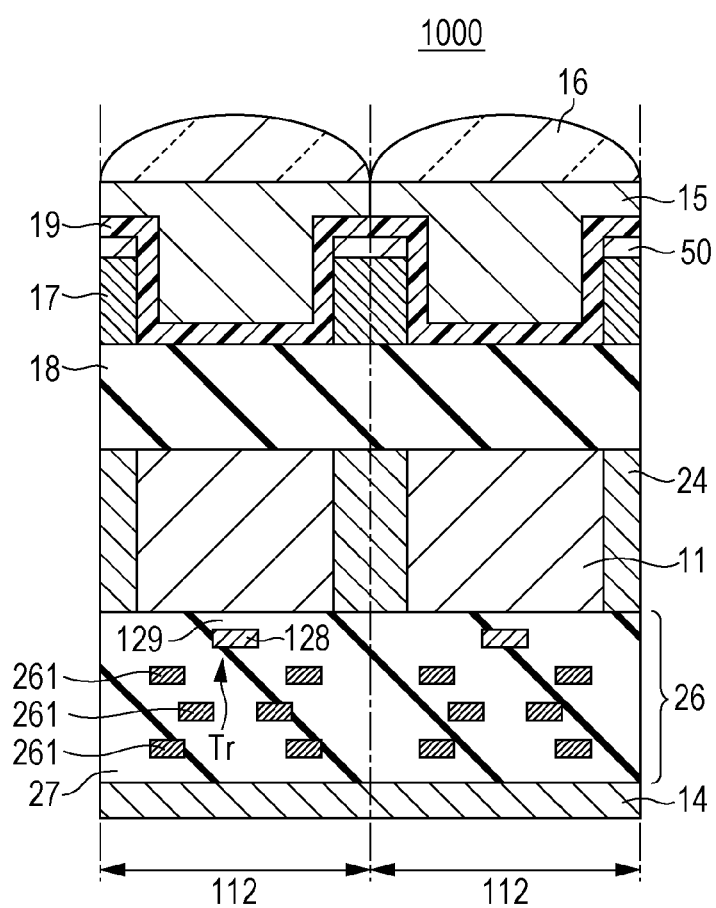
FIG. 20 is a cross-sectional view of the solid-state imaging device according to a tenth embodiment.

As shown in FIG. 20, the solid-state imaging device 1000 has the oxide film 50 formed on one surface of the light shielding film 17. An adhesive film 19 is deposited on the oxide film 50 and insulator film 18 and on the side walls of the light shielding film 17. The adhesive film 19 is made of a material having good adhesion to the oxide film 50 and light shielding film 17. The oxide film 50 is formed on one surface of the light shielding film 17 but, unlike the solid-state imaging device 900 in FIG. 18, not formed on the insulator film 18 and on the side walls of the light shielding film 17.

Next, a method of manufacturing the solid-state imaging device 1000 will be described. The steps until the film 171 is formed are the same as those in FIGS. 3A and 3B and therefore description thereof will be omitted.

Figure 21A:
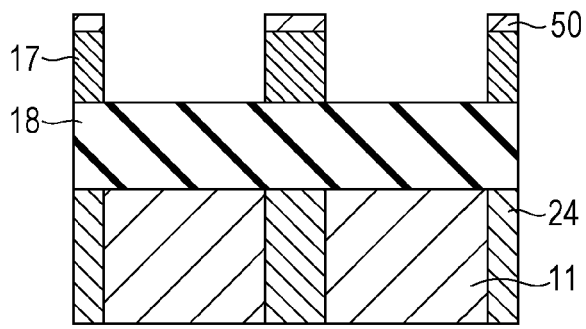
FIGS. 21A to 21D illustrate steps of manufacturing the solid-state imaging device according to the tenth embodiment.

After the film 171 is formed, an oxide film 50 is deposited on the film 171 as shown in FIG. 21A. Subsequently, the film 171 is patterned by lithography to form in the film 171 apertures for pixels 112 and then the film 171 and oxide film 50 are etched to form a light shielding film 17 and the oxide film 50.

Figure 21B:
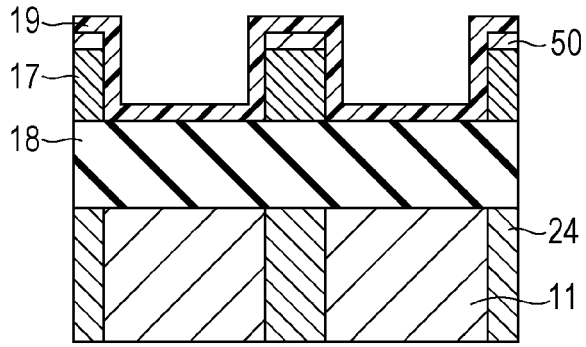
Figure 21C:
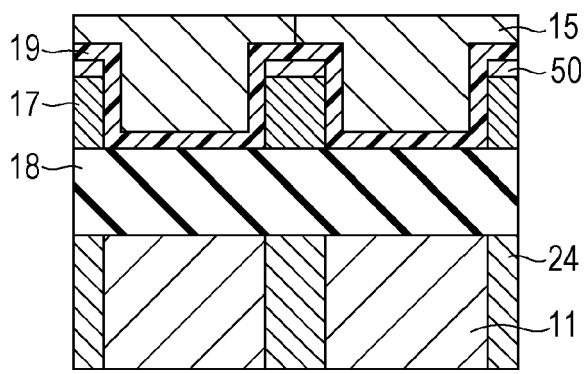
Figure 21D:
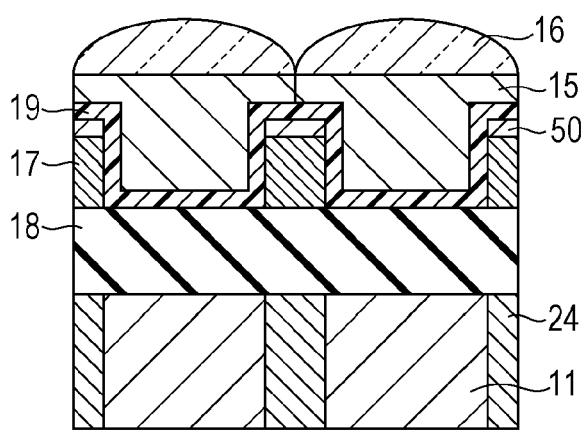

Next, an adhesive film 19 is deposited or applied on the light shielding film 17 and oxide film 50 using a spin coating process, spray coating process, slit coating process, or the like (FIG. 21B). Next, color filters 15 are formed (FIG. 21C) and microlenses 16 are formed on the color filters 15 (FIG. 21D).

The lack of the oxide film 50 between the insulator film 18 and the color filters 15 as described above allows the solid-state imaging device 1000 according to the present embodiment to be reduced in height compared with the solid-state imaging device 900 shown in FIG. 18. With this, the solid-state imaging device 1000 can achieve the reduction in color mixture and improve the sensitivity. The adhesive film 19 provided between one surface of the light shielding film 17 and the color filters 15 can suppress the detachment of color filters 15. Further, the color filters 15 can be formed by self alignment in a manner to be based on the light shielding film 17 which is formed between pixels, enabling improvement of overlay accuracy between the light shielding film 17 and the color filters 15.

In the ninth and tenth embodiments, the oxide film 40, 50 is provided in the solid-state imaging device 100 in FIG. 2. Instead, the oxide film 40, 50 may be provided in the solid-state imaging device 400 in FIG. 8.

(Eleventh Embodiment)

Next, a solid-state imaging device 1100 according to an eleventh embodiment will be described. Since the solid-state imaging device 1100 has the same configuration as the solid-state imaging device 100 in FIG. 2 except for the shape of the light shielding film, the same components will be denoted with the same reference characters and description thereof will be omitted.

Figure 22A:
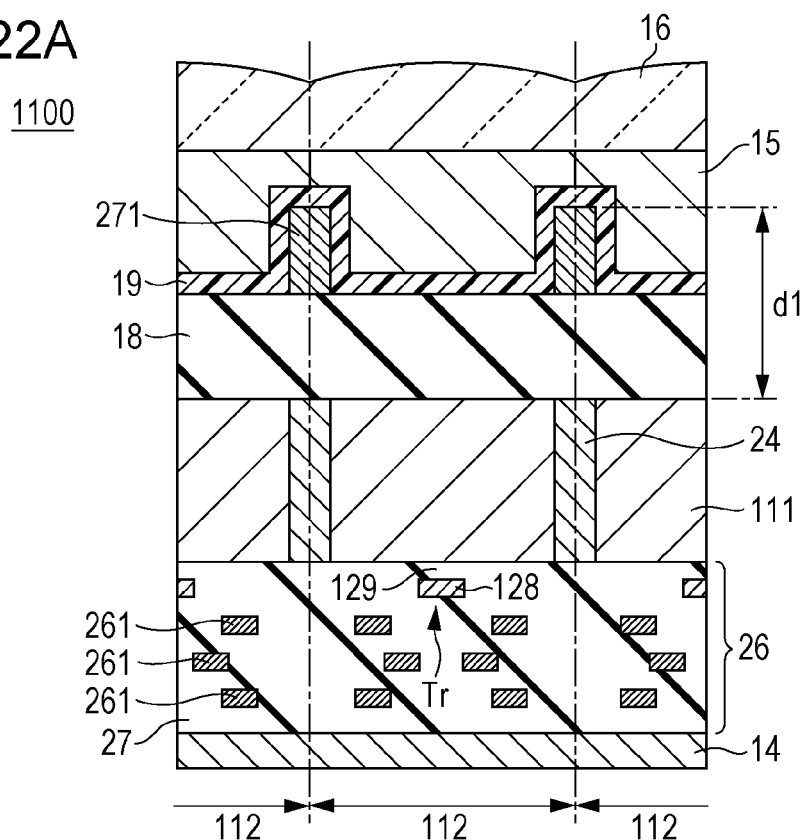
FIGS. 22A and 22B are cross-sectional views of a solid-state imaging device according to an eleventh embodiment.
Figure 22B:
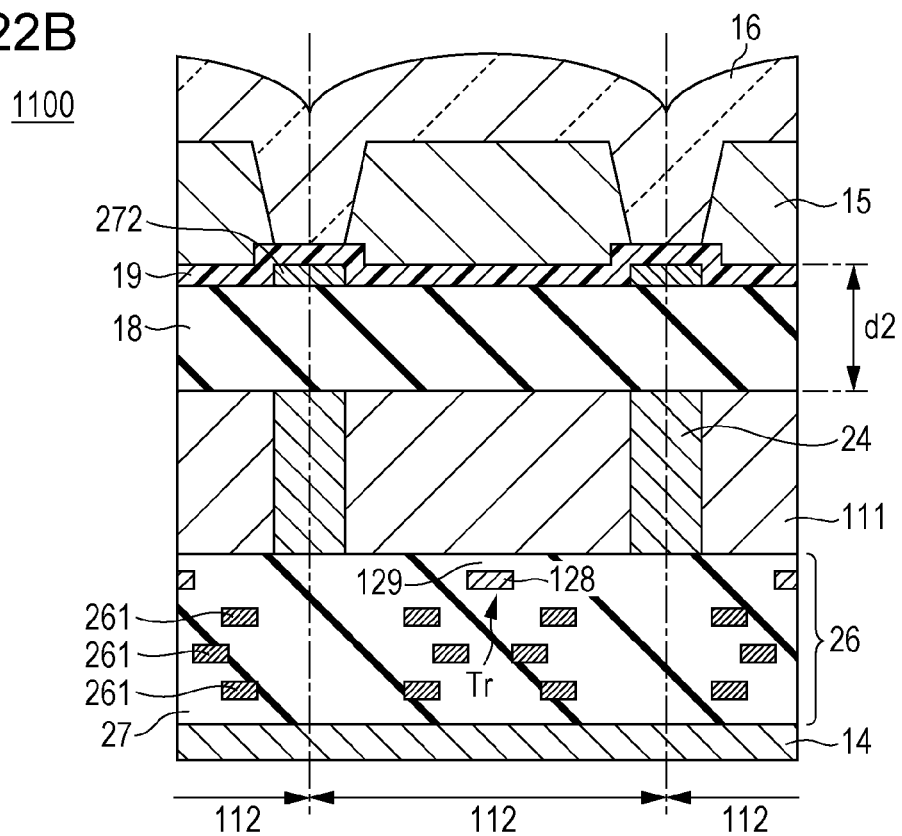

Referring now to FIGS. 22A and 22B, the solid-state imaging device 1100 will be described in detail. FIG. 22A is a sectional view of the solid-state imaging device 1100 along a line in a side direction across the pixel 112. FIG. 22B is a sectional view of the solid-state imaging device 1100 along a line in a diagonal direction across the pixel 112.

The light shielding film includes first light shielding portions 271 and second light shielding portions 272. The first light shielding portions 271 and the second light shielding portions 272 are provided between the color filter components of the color filters 15. The distance from the pixel 112 to the surface of the first light shielding portion 271 closest to the microlens 16 is longer than that of the second light shielding portion 272. More specifically, a relationship d1>d2 (d1 and d2 are nonzero) is established, where d1 is the distance from the pixel 112 to the surface of the first light shielding portion 271 closest to the microlens 16 and d2 is the distance from the pixel 112 to the surface of the second light shielding portion 272 closest to the microlens 16.

In the present embodiment, the region extending from one dot-and-dash line to another dot-and-dash line in FIGS. 22A and 22B in which a pixel 112, a color filter component of the color filter 15, and a microlens 16 are contained is referred to as a pixel region. The dot-and-dash line indicating the boundary of each pixel region in FIGS. 22A and 22B is referred to as a pixel boundary. The pixel region of the solid-state imaging device 1100 according to the present embodiment has a square plane; the segment passing through the midpoints of the opposite sides of this plane is referred to as being in the side direction across the pixel region, while the segment extending between the opposing corners of the plane is referred to as being in the diagonal direction across the pixel region.

Figure 23A:
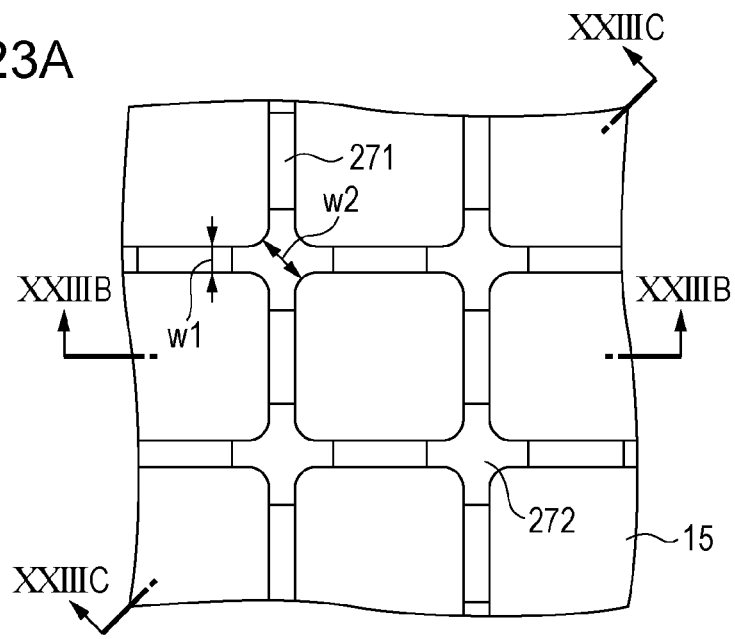
FIGS. 23A to 23C show a light shielding film according to the eleventh embodiment.
Figure 23B:
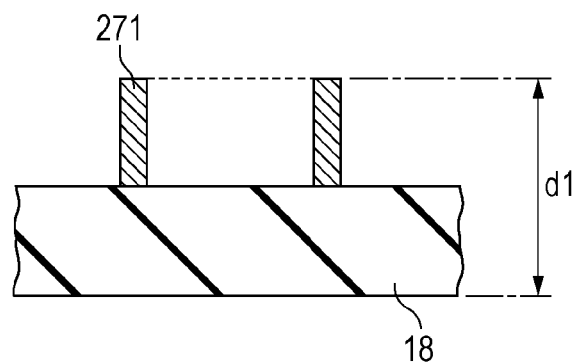
Figure 23C:
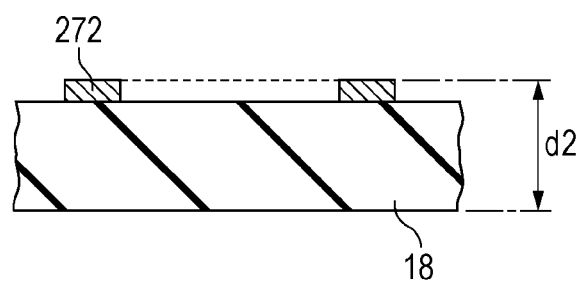

Referring now to FIGS. 23A to 23C, the light shielding film according to the present embodiment will be described.

FIG. 23A is a plan view of the light shielding film. FIG. 23B is a cross-sectional view of the light shielding film and insulator film 18 along the line XXIIIB-XXIIIB (in the side direction across the pixel region) in FIG. 23A; FIG. 23C is a cross-sectional view of the light shielding film and insulator film 18 along the line XXIIIC-XXIIIC (in the diagonal direction across the pixel region) in FIG. 23A.

The light shielding film is formed on the pixel boundaries, i.e., around the pixel region and between the color filter components of the color filters 15. The light shielding film is formed in the form of a lattice as shown in FIG. 23A.

The light shielding film includes first light shielding portions 271 formed on the side portions of the pixel regions and second light shielding portions 272 formed at the corner portions of the pixel boundaries.

The first light shielding portions 271 are formed on the side portions of the lattice-shaped light shielding film. The first light shielding portion 271 has a predetermined film thickness. The pixel region is square as viewed from the microlens 16. A region having a rectangular shape with a certain width and four sides is referred to as a side portion of the pixel region. The first light shielding portions 271 are formed on the side portions of the pixel region between the color filter components of the color filters 15. The first light shielding portion 271 has an end surface (first end surface) being in contact with the microlens 16 and another end surface (second end surface) opposing the first end surface. The first light shielding portion 271 has a substantially tapered shape having a predetermined film thickness d1, with the first end surface being narrower than the second end surface.

The second light shielding portions 272 are formed at the intersections in the lattice-shaped light shielding film. The second light shielding portion 272 is cruciform as viewed from above and has a predetermined film thickness that is thinner than the film thickness of the first light shielding portion 271. The pixel region is square as viewed from the microlens 16. A region including a corner of the square and having a certain width is referred to as a corner portion of the pixel region. The second light shielding portions 272 are formed on the same plane as the color filters 15, on the corner portions of the pixel regions. The second light shielding portion 272 includes an end surface (first end surface) being in contact with the microlens 16 and another end surface (second end surface) opposing the first end surface.

In the solid-state imaging device 1100 according to the present embodiment, the light shielding film is formed on the insulator film 18 toward the back side of the substrate 111.

Consequently, the distance from the front side of the pixel 112 to the end surface of the first light shielding portion 271 toward the microlens 16 is equal to the sum of the film thickness of the first light shielding portion 271 and the film thickness of the insulator film 18. The distance from the front side of the pixel 112 to the end surface of the second light shielding portion 272 toward the microlens 16 is equal to the sum of the film thickness of the second light shielding portion 272 and the film thickness of the insulator film 18. Because the film thickness of the insulator film 18 is fixed and the film thickness of the first light shielding portion 271 is greater than the film thickness of the second light shielding portion 272, the distance d1 from the front side of the pixel 112 to the end surface of the first light shielding portion 271 toward the microlens 16 is greater than the distance from the front side of the pixel 112 to the end surface of the second light shielding portion 272 toward the microlens 16.

Referring now to FIGS. 24A to 24F, a method of manufacturing the solid-state imaging device 1100 according to the present embodiment will be described. The steps until the insulator film 18 is formed are the same as those for the solid-state imaging device 100 in FIG. 2 and therefore description thereof will be omitted.

Parts (a) in FIGS. 24A to 24F are sectional views of the pixel region along a line in the side direction; parts (b) in FIGS. 24A to 24F are sectional views of the pixel region along a line in the diagonal direction. The dot-and-dash lines in FIGS. 24A to 24F indicate the boundaries of the pixel regions.

As shown in FIG. 24A, a film 31 is formed on the insulator film 18. The film 31 is made of a material that blocks incident light. When a conductive material, for example, is employed as the light shielding film, aluminum, tungsten, or the like may be employed. When an organic material is employed as the light shielding film, an organic film containing carbon or titan black particles or any other material having black pigments scattered therein may be employed.

As shown in FIG. 24B, a first photoresist 32 is formed on the film 31. The first photoresist 32 has on the corner portions of the pixel region cruciform apertures that are similar to, but wider than, those of the second light shielding portions 272 (see reference character A in part (b) in FIG. 24B).

The first photoresist 32 is used as the mask for dry etching the underlying film 31 (see FIG. 24C). Here, as indicated by reference character B in part (b) in FIG. 24C, the dry etching is stopped before the entire thickness of the film 31 is etched. With this, recesses are formed in the film 31.

Once the dry etching is completed, the first photoresist 32 is removed and a second photoresist 33 is formed on the film 31. The second photoresist 33 is formed on the side portions of the pixel regions in a shape similar to the first light shielding portion 271 and on the corner portions of the pixel regions in a shape similar to the second light shielding portion 272. The portions of the second photoresist 33 to be formed on the corner portions of the pixel regions are formed in the recesses in the film 31 (see reference character C in part (b) in FIG. 24D).

The second photoresist 33 is employed as the mask for dry etching the underlying film 31 as shown in FIG. 24E and then the second photoresist 33 is removed as shown in FIG. 24F to form the first light shielding portions 271 and second light shielding portions 272.

In this manner, photoresist patterning and dry etching are conducted twice to form the first light shielding portions 271 and second light shielding portions 272 with different thicknesses.

The methods of forming the adhesive film 19 and color filters 15 are the same as those for the solid-state imaging device 100 in FIG. 2 and therefore description thereof will be omitted.

Referring now to FIGS. 25A to 25F, a method of forming microlenses 16 will be described. Parts (a) in FIGS. 25A to 25F are sectional views of the pixel region along a line in the side direction; parts (b) in FIGS. 25A to 25F are sectional views of the pixel region along a line in the diagonal direction.

Figure 25A:
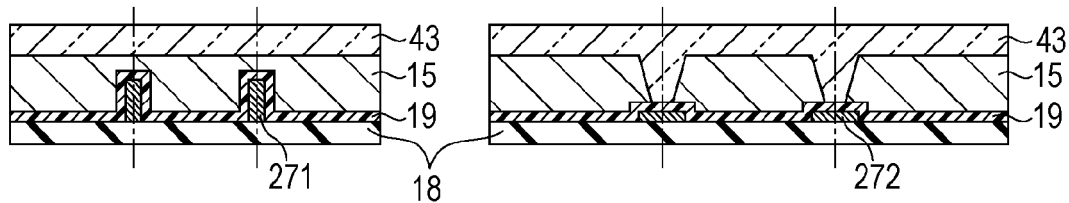
FIGS. 25A to 25F illustrate steps of manufacturing the microlens according to the eleventh embodiment.

After the color filters 15 are formed as shown in FIG. 25A, a microlens material 43 is formed on the color filters 15. As the microlens material, polystyrene resin, novolac resin, copolymer resin containing any one of these resins and acrylic resin, or a resin containing aromatic rings as the side chains of the acrylic resin may be used.

Figure 25B:
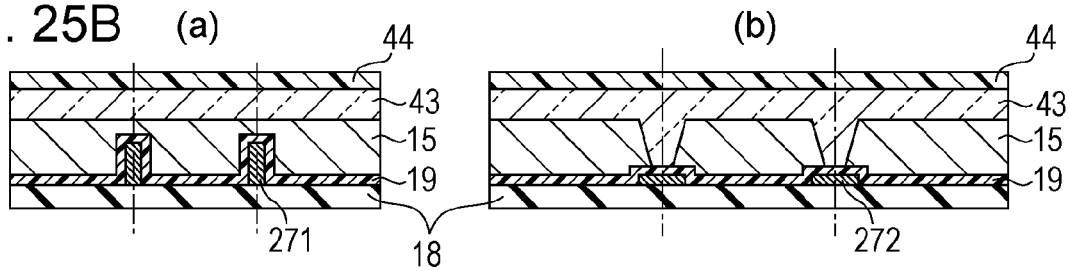

As shown in FIG. 25B, a positive photoresist 44 is applied on the microlens material 43. The positive photoresist 44 may contain novolac resin, for example, as the main component.

Figure 25C:
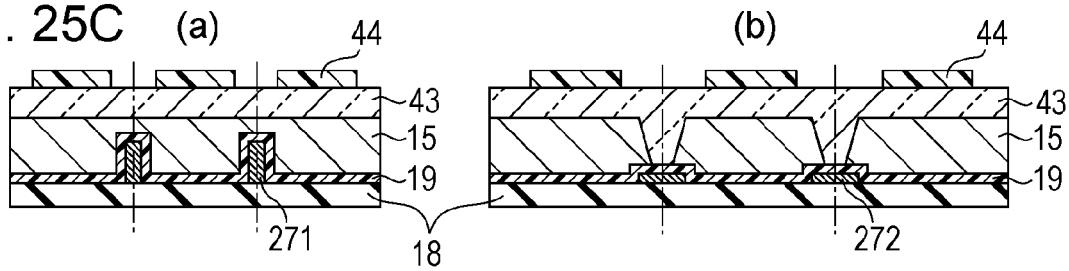

Next, the positive photoresist 44 is patterned for each pixel by photolithography (FIG. 25C).

Figure 25D:
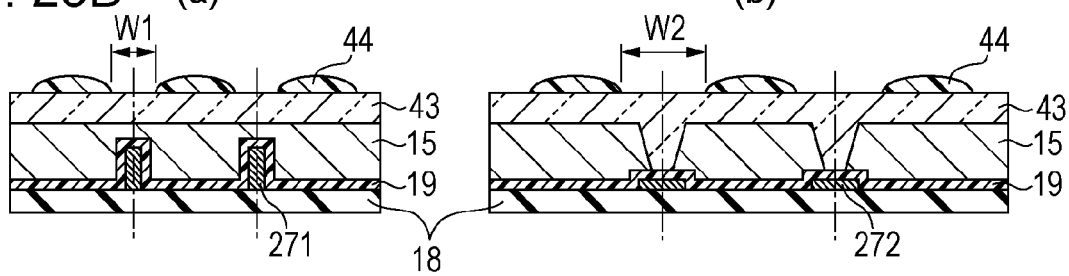

The patterned positive photoresist 44 is subjected to heat treatment at a temperature higher than its softening point to form lens-shaped positive photoresists 44 (FIG. 25D). The line width of the positive photoresist 44 is narrower in the side direction (W1) of the pixel region than in the diagonal direction (W2).

Figure 25E:
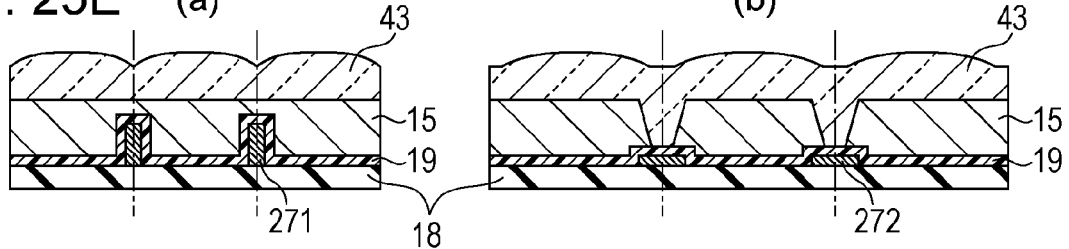

The lens-shaped positive photoresists 44 are used as the masks for dry etching to transfer the lens-shaped patterns to the underlying microlens material 43 (FIG. 25E). Since the line width of the positive photoresist 44 is narrower in the side direction (W1) of the pixel region than in the diagonal direction (W2), there is substantially no spacing between the lenses adjacent in the side direction of the pixel region while there is spacing between the lenses adjacent in the diagonal direction.

Figure 25F:
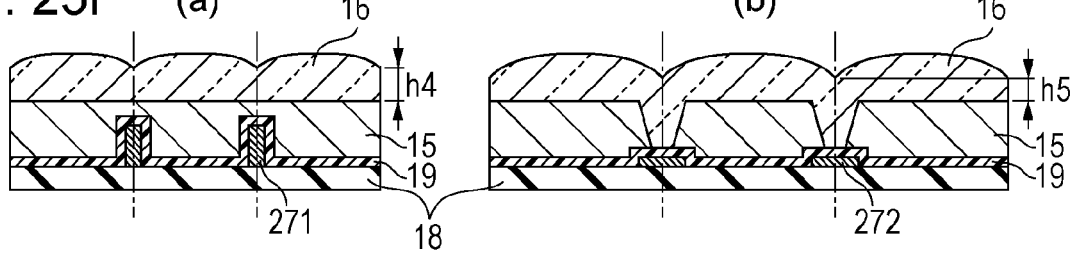

For the solid-state imaging device 1100 according to the present embodiment, etching is continued to eliminate the spacing between the lenses adjacent in the diagonal direction. As shown in FIG. 25F, after the spacing between the lenses adjacent in the side direction is substantially eliminated, etching is continued to reduce the spacing between the lenses adjacent in the diagonal direction to virtually zero. When any spacing left between the adjacent microlenses 16 does not exceed 200 nm, it is sufficiently smaller than the light wavelength and does not affect the sensitivity of the solid-state imaging device. Accordingly, the adjacent microlenses 16 are substantially in contact with each other and the spacing between the adjacent lenses is considered to be virtually zero.

When the microlenses 16 are formed as described above, the thickness h4 of the side portions of the pixel boundary of the microlens 16 becomes greater than the thickness h5 of the corner portions. More specifically, the microlenses 16 are formed such that the upper surfaces of the microlenses 16 are located at the same level and the bottoms of the microlenses 16 formed on the side portions are located at a lower position (positions closer to the color filters 15) than the bottoms of the microlenses 16 formed on the corner portions of the pixel regions (positions where adjacent microlenses 16 are brought into contact with each other).

Referring now to FIGS. 26A to 26D, effects of making the film thickness of the second light shielding portion 272 thinner than the film thickness of the first light shielding portion 271 will be described.

Figure 26A:
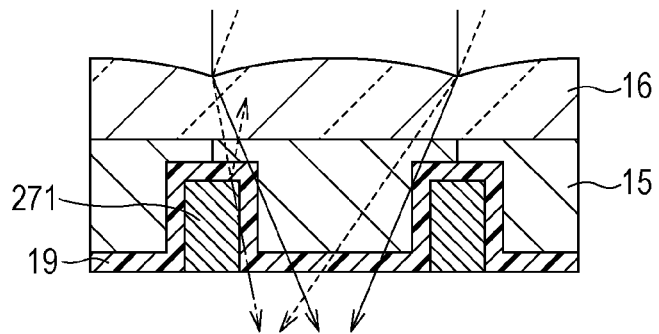
FIGS. 26A to 26D are cross-sectional views of a solid-state imaging device according to the eleventh embodiment.
Figure 26B:
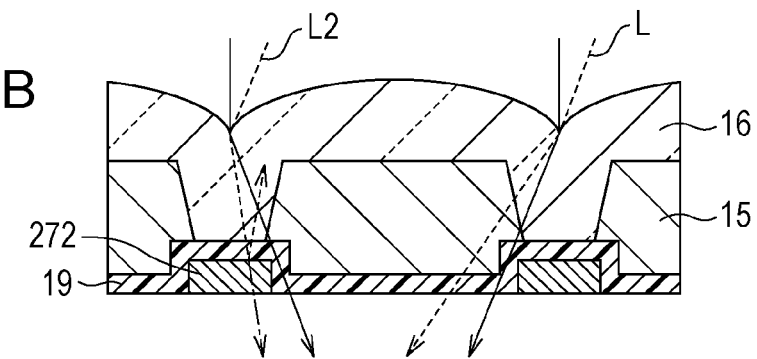

FIGS. 26A and 26B are sectional views of the microlens 16, color filter 15, light shielding film, and adhesive film 19 of the solid-state imaging device 1100 according to the present embodiment.

Figure 26C:
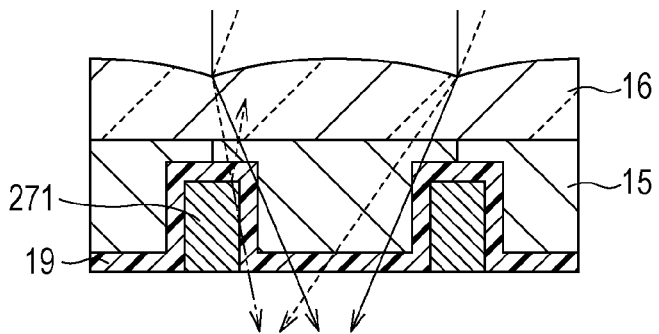
Figure 26D:
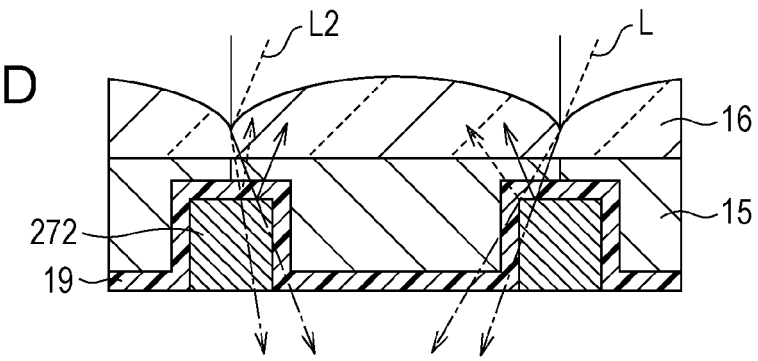

FIGS. 26C and 26D illustrate solid-state imaging device with the film thickness of the second light shielding portion 272 being equal to the film thickness of the first light shielding portion 271. The second light shielding portion 272 has the same configuration as in FIGS. 26A and 26B except for the film thickness thereof.

In FIGS. 26A to 26D, the vertically incident light converged by the microlens 16 is indicated by solid lines, while the obliquely incident light with the chief ray tilted is indicated by dashed lines.

As shown in FIGS. 26A and 26C, in the plane extending through the center of the microlens 16 of the solid-state imaging device 1100 in parallel to the pixel boundaries (i.e., cross section of the pixel region in the side direction), the vertically incident light enters the color filter 15 without being blocked by the first light shielding portions 271. On the other hand, the obliquely incident light is partially reflected off the first light shielding portions 271.

As shown in FIG. 26D, in the plane extending through the center of the microlens 16 of the solid-state imaging device 1100 and through the diagonal line across the pixel region (i.e., cross section of the pixel region in the diagonal direction), the incident light is blocked by the second light shielding portions 272 and the so-called mechanical vignetting occurs accordingly. Particularly, at the corner portions of the microlens 16, both the vertically incident light and obliquely incident light are reflected off the light shielding films and thereby the optical sensitivity of the solid-state imaging device 1100 is degraded.

The second light shielding portions 272 are formed by depositing a film 171 on the insulator film 18, then forming a resist pattern by lithography, and dry-etching the resist pattern. The resist pattern formed by lithography has openings with a rounded shape such that the apertures become planarly small (see FIG. 23A). The width in the diagonal direction (W2) of the second light shielding portion 272, therefore, becomes wider than the width in the side direction (W1). Since the line width W2 of the second light shielding portion 272 becomes wider than the line width W1 of the first light shielding portion 271, much of the light incident through the corner portions of the microlens 16 is reflected off the second light shielding portions 272 and thereby the optical sensitivity of the solid-state imaging device 1100 is degraded.

When the film thickness of the second light shielding portion 272 is thinner than the film thickness of the first light shielding portion 271 as shown in FIG. 26B, the incident light blocked by the second light shielding portion 272 is decreased. Especially at the corner portions of the microlens 16, vertically incident light passes through the color filter 15 without being blocked by the light shielding film. The obliquely incident light is partially reflected off the second light shielding portions 272, but the obliquely incident light L that has failed to pass through the color filter 15 in FIG. 26D passes through the color filter 15.

In this manner, reducing the film thickness of the second light shielding portion 272 can decrease the incident light reflected off the light shielding film and thereby suppress the reduction in optical sensitivity of the solid-state imaging device 1100. Not reducing the film thickness of the first light shielding portion 271 can reduce color mixture due to the leakage of incident light into the adjacent photoelectric conversion elements 11.

Figure 27:
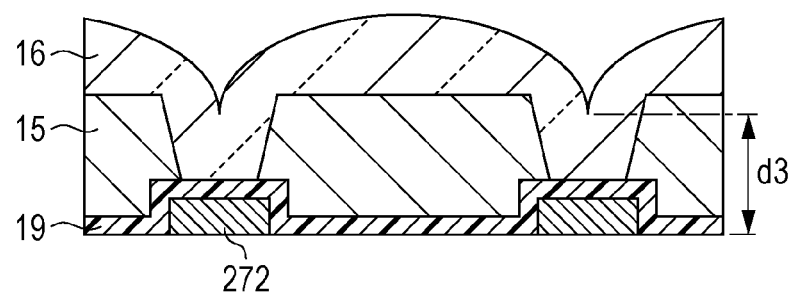
FIG. 27 is another cross-sectional view of the solid-state imaging device according to the eleventh embodiment.

Making the film thickness of the second light shielding portion 272 thinner than the film thickness of the color filter 15 produces a region in which the color filter 15 is not formed above the second light shielding portion 272. This allows the corner portions of the microlenses 16 to be formed in the layer of the color filters 15 as shown in FIG. 27. This means that the distance d3 from the surface of the color filter 15 toward the photoelectric conversion element 11 to the corner portion of the microlens 16 can be made shorter than the film thickness of the color filter 15 and thus a thinner microlens 16 can be formed.

The adhesive film 19 provided between the light shielding films and the color filters 15 suppresses the detachment of color filters 15.

In the eleventh embodiment, the film thickness is reduced at the corner portions of the light shielding film in the solid-state imaging device 100 according to the first embodiment. Instead, the film thickness may be reduced at the corner portions of the light shielding film in the solid-state imaging devices 200 to 1000 of the second to tenth embodiments.

(Twelfth Embodiment)

Figure 28:
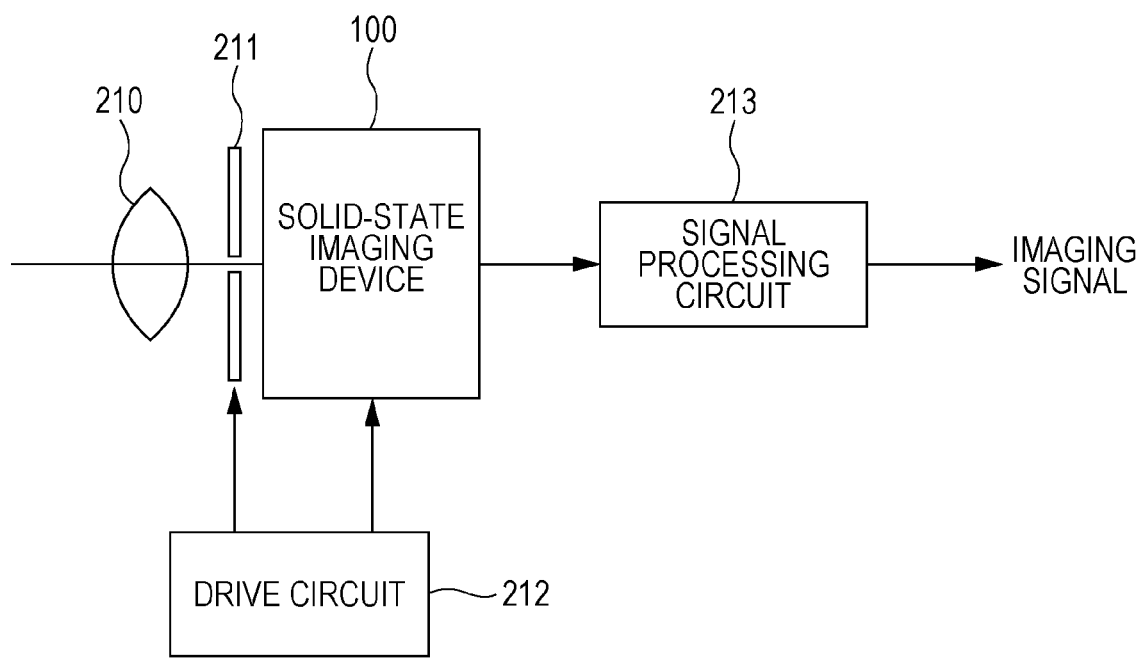
FIG. 28 illustrates an electronic apparatus according to a twelfth embodiment.

Referring now to FIG. 28, an exemplary application of the solid-state imaging device 100 will be described in the twelfth embodiment of the present technology. FIG. 28 shows the solid-state imaging device 100 applied in an electronic apparatus 1200. Examples of the electronic apparatus 1200 include a digital camera, a camera embedded in a mobile telephone, a scanner, and a surveillance camera. Here described is a case in which the electronic apparatus 1200 is a digital camera.

The electronic apparatus 1200 according to the present embodiment has a solid-state imaging device 100, an optical lens 210, a shutter device 211, a drive circuit 212, and a signal processing circuit 213.

The optical lens 210 focuses image light (incident light) from a subject onto the imaging surface of the solid-state imaging device 100. With this, a signal charge is accumulated for a predetermined period in the solid-state imaging device 100.

The shutter device 211 controls the light-irradiated period and light-shielded period of the solid-state imaging device 100. The drive circuit 212 supplies drive signals for controlling the transfer operation of the solid-state imaging device 100 and the shutter operation of the shutter device 211.

According to the drive signal, the solid-state imaging device 100 outputs the signal charge accumulated in the photoelectric conversion element 11 as an electric signal.

The signal processing circuit 213 performs various signal processing operations. The signal processing circuit 213 generates video signals by processing the electric signals output from the solid-state imaging device 100 and outputs the video signals to a memory or other storage unit, a monitor, or the like, which are not shown.

The electronic apparatus 1200 according to the present embodiment, which is provided with the solid-state imaging device 100 according to the first embodiment as described above, can suppress the detachment of color filters 15 and improve the image quality of the video signals.

In the above example, the solid-state imaging device 100 according to the first embodiment is mounted on the electronic apparatus 1200. Alternatively, the solid-state imaging device according to any one of the second to tenth embodiments may be mounted on the electronic apparatus 1200.

Although in the above-mentioned embodiments, the CMOS back-illuminated-type solid-state imaging device is described as an exemplary solid-state imaging device, it will be appreciated by those skilled in the art that the present technology is not limited thereto but is also applicable to a CCD solid-state imaging device or a front-illuminated-type solid-state imaging device.

The embodiment of the present technology may also adopt any one of the following configurations:

(1) A solid-state imaging device including:
pixels each having a photoelectric conversion element for converting incident light to an electric signal;
color filters associated with the pixels and having a plurality of color filter components;
microlenses converging the incident light through the color filters to the photoelectric conversion elements;
a light shielding film disposed between the color filter components of the color filters; and
a nonplanarized adhesive film provided between the color filters and the light shielding film.

(2) The solid-state imaging device according to item (1), wherein the color filters are planarized.

(3) The solid-state imaging device according to item (1) or (2), wherein the adhesive film is provided between one surface of the light shielding film and the color filters.

(4) The solid-state imaging device according to any one of items (1) to (3), further including:
an insulator film between the photoelectric conversion elements and the color filters;
wherein the color filters are embedded in the insulator film.

(5) The solid-state imaging device according to any one of items (1) to (4), wherein an oxide film is provided between the adhesive film and the light shielding film.

(6) The solid-state imaging device according to item (5), wherein the oxide film is provided on one surface of the light shielding film.

(7) The solid-state imaging device according to any one of items (1) to (6),
wherein the light shielding film includes
first light shielding portions formed on side portions of the color filter components, and
second light shielding portions formed at corner portions of the pixel regions,
wherein a distance from the front side of the pixel to an end surface of the second light shielding portion toward the microlens is shorter than a distance from the front side of the pixel to an end surface of the first light shielding portion toward the microlens.

(8) A method of manufacturing a solid-state imaging device, the method including:
forming pixels each having a photoelectric conversion element for converting incident light to an electric signal;
forming a light shielding film to be provided between a plurality of color filter components of color filters;
depositing a nonplanarized adhesive film on the light shielding film;
forming the color filters on the adhesive film between the light shielding films; and
forming on the color filters microlenses converging the incident light through the color filters onto the photoelectric conversion elements.

(9) An electronic apparatus including:
a solid-state imaging device including
pixels each having a photoelectric conversion element for converting incident light to an electric signal,
color filters associated with the pixels and having a plurality of color filter components,
microlenses converging the incident light through the color filters to the photoelectric conversion elements,
a light shielding film disposed between the color filter components of the color filters, and
a nonplanarized adhesive film provided between the color filters and the light shielding film; and
an optical lens guiding the incident light to the photoelectric conversion elements; and
a signal processing circuit processing the electric signal.

Finally, each of the above embodiments is merely an example of the present technology and the present technology is not limited to any one of the above embodiments. It should be understood by those skilled in the art that various modifications may occur depending on design and other factors insofar as they are within the scope of the present technology.

What is claimed is:

1. A solid-state imaging device comprising:
a plurality of pixels, respective pixels having a photoelectric conversion element configured to convert incident light to an electric signal;
color filters associated with the pixels and having a plurality of color filter components;
microlenses configured to converge the incident light through the color filters to the photoelectric conversion elements;
a light shielding portion disposed between respective ones of the plurality of color filter components; and
a transparent film having a nonplanar upper surface disposed between the color filters and the light shielding portion, wherein a thickness of the transparent film is less than a thickness of the light shielding portion.

2. The solid-state imaging device according to claim 1, wherein the transparent film includes a thermoplastic resin material selected from the group including an acrylic resin, a phenolic resin, a siloxane resin, a copolymer thereof, and an epoxy resin.

3. The solid-state imaging device according to claim 1, wherein the color filters are planarized.

4. The solid-state imaging device according to claim 1, wherein the transparent film is provided between one surface of the light shielding film and the color filters.

5. The solid-state imaging device according to claim 1, further comprising:
an insulator film between the photoelectric conversion elements and the color filters.

6. The solid-state imaging device according to claim 1, wherein the transparent film comprises an oxide film.

7. The solid-state imaging device according to claim 6, wherein the oxide film is provided on one surface of the light shielding portion.

8. The solid-state imaging device according to claim 1,
wherein the light shielding portion includes
first light shielding portions formed on side portions of the color filter components, and
second light shielding portions formed at corner portions of the pixel regions,
wherein a distance from the front side of the pixel to an end surface of the second light shielding portion toward the microlens is shorter than a distance from the front side of the pixel to an end surface of the first light shielding portion toward the microlens.

9. The solid-state imaging device according to claim 1, wherein the microlenses are disposed directly on respective ones of the color filters.

10. The solid-state imagining device according to claim 1, further comprising:
a semiconductor substrate having a first side as a light incident side, and a second side opposite to the first side, wherein the semiconductor substrate comprises the photoelectric conversion element.

11. The solid-state imaging device according to claim 10, wherein the thickness of the semiconductor substrate is 3-5 µm.

12. The solid-state imaging device according to claim 10, further comprising:
a plurality of transistors disposed adjacent to the second side of the semiconductor substrate.

13. The solid-state imaging device according to claim 12, wherein the plurality of transistors comprises a transfer transistor associated with the photoelectric conversion element.

14. The solid-state imaging device according to claim 12, wherein the plurality of transistors comprises a reset transistor and an amplification transistor.

15. The solid-state imaging device according to claim 14, wherein the plurality of transistors further comprises a select transistor configured to selectively enable operation of the amplification transistor.

16. The solid-state imaging device according to claim 12, further comprising:
a drive circuit configured to drive the plurality of transistors; and
a column circuit coupled to a signal line and configured to perform correlated double sampling of the electrical signal.

17. The solid-state imaging device according to claim 12, wherein a wiring layer is disposed adjacent to the second side of the semiconductor substrate.

18. The solid-state imaging device according to claim 17, wherein the wiring layer comprises a signal line connected to at least one transistor of the plurality of transistors.

19. The solid-state imaging device according to claim 17, further comprising:
a support substrate disposed on the wiring layer.

20. The solid-state imaging device according to claim 1, further comprising:
an element separation region disposed between adjacent ones of the photoelectric conversion elements.

21. The solid-state imaging device according to claim 1, further comprising:
a digital signal processing circuit configured to receive and process a digital signal.

22. The solid-state imaging device according to claim 21, further comprising:
a memory configured to receive and store a processed digital signal from the digital signal processing circuit.

23. The solid-state imaging device according to claim 1, wherein the thickness of the color filters is 100 nm to 1 μm.

24. The solid-state imaging device according to claim 1, wherein the color filters include filters of at least two different colors selected from green, red, and blue.

25. The solid-state imaging device according to 24, wherein the color filter includes an ND filter.

26. The solid-state imaging device according to claim 1, wherein the transparent film comprises a nitride film.

27. The solid-state imaging device according to claim 1, wherein the light shielding portion is a material selected from the group consisting of aluminum and tungsten.

28. The solid-state imaging device according to claim 1, wherein the light shielding portion is a material selected from the group consisting of carbon black and titanium black.

29. A method of manufacturing a solid-state imaging device, the method comprising:
forming a plurality of pixels, respective pixels having a photoelectric conversion element configured to convert incident light to an electric signal;
forming a light shielding portion to be provided between a plurality of color filter components of color filters;
depositing a transparent film having a nonplanar upper surface on the light shielding portion, wherein a thickness of the transparent film is less than a thickness of the light shielding portion;
forming the color filters on the transparent film between the light shielding portions; and
forming on the color filters microlenses configured to converge the incident light through the color filters onto the photoelectric conversion elements.

30. An electronic apparatus comprising:
a solid-state imaging device including:
a plurality of pixels, respective pixels having a photoelectric conversion element configured to convert incident light to an electric signal,
color filters associated with the pixels and having a plurality of color filter components,
microlenses configured to converge the incident light through the color filters to the photoelectric conversion elements,
a light shielding portion disposed between respective ones of the plurality of color filter components, and
a transparent film having a nonplanar upper surface disposed between the color filters and the light shielding portion, wherein a thickness of the transparent film is less than a thickness of the light shielding portion;
an optical lens configured to guide the incident light to the photoelectric conversion elements; and
a signal processing circuit configured to process the electrical signal.

* * * * *